US012538835B2

United States Patent
Hung et al.

(10) Patent No.: US 12,538,835 B2
(45) Date of Patent: Jan. 27, 2026

(54) INTEGRATED CHIP PACKAGE INCLUDING A CRACK-RESISTANT LID STRUCTURE AND METHODS OF FORMING THE SAME

(71) Applicant: Taiwan Semiconductor Manufacturing Company Limited, Hsinchu (TW)

(72) Inventors: Wensen Hung, Zhubei (TW); Tsung-Yu Chen, Hsinchu (TW); Hsuan-Ning Shih, Taoyuan (TW); Wen-Hsin Wei, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 719 days.

(21) Appl. No.: 17/898,834

(22) Filed: Aug. 30, 2022

(65) Prior Publication Data
US 2023/0386945 A1 Nov. 30, 2023

Related U.S. Application Data

(60) Provisional application No. 63/346,277, filed on May 26, 2022.

(51) Int. Cl.
*H01L 23/053* (2006.01)
*H01L 21/52* (2006.01)
(Continued)

(52) U.S. Cl.
CPC ............ *H01L 23/053* (2013.01); *H01L 21/52* (2013.01); *H01L 23/367* (2013.01); *H01L 23/42* (2013.01);
(Continued)

(58) Field of Classification Search
CPC ..... H01L 23/053; H01L 23/367; H01L 23/42; H01L 23/5383; H01L 23/5385;
(Continued)

(56) References Cited

U.S. PATENT DOCUMENTS

| 2018/0350754 A1* | 12/2018 | Huang ............... H01L 25/0655 |
| 2021/0098330 A1 | 4/2021 | Wang et al. |
| 2021/0193550 A1 | 6/2021 | Hung et al. |

FOREIGN PATENT DOCUMENTS

| TW | 201903996 A | 1/2019 |
| TW | 202220125 A | 5/2022 |

OTHER PUBLICATIONS

Taiwan Patent and Trademark Office; Jianq Chyun Intellectual Property Office; TW Application No. 112105575; Office Action dated Sep. 22, 2023; 11 pages.

* cited by examiner

*Primary Examiner* — Peniel M Gumedzoe
(74) *Attorney, Agent, or Firm* — The Marbury Law Group, PLLC

(57) ABSTRACT

A chip package structure includes an assembly containing an interposer and semiconductor dies; a packaging substrate attached to the assembly through solder material portions; and a lid structure attached to the packaging substrate. The lid structure includes: a first plate portion having a first thickness and located in an interposer-projection region having an areal overlap with the interposer in a plan view; a second plate portion having a second thickness that is less than the first thickness, laterally surrounding, and adjoined to, the first plate portion, and located outside the interposer-projection region; and a plurality of foot portions adjoined to the second plate portion, laterally spaced from the first plate (Continued)

portion, and attached to a respective top surface segment of the packaging substrate through a respective adhesive portion.

20 Claims, 37 Drawing Sheets

(51) Int. Cl.
*H01L 23/00* (2006.01)
*H01L 23/367* (2006.01)
*H01L 23/42* (2006.01)
*H01L 23/538* (2006.01)
*H01L 25/18* (2023.01)

(52) U.S. Cl.
CPC ...... *H01L 23/5383* (2013.01); *H01L 23/5385* (2013.01); *H01L 24/29* (2013.01); *H01L 24/32* (2013.01); *H01L 24/83* (2013.01); *H01L 25/18* (2013.01); *H01L 2224/2929* (2013.01); *H01L 2224/29324* (2013.01); *H01L 2224/29339* (2013.01); *H01L 2224/29347* (2013.01); *H01L 2224/29386* (2013.01); *H01L 2224/32245* (2013.01); *H01L 2224/8385* (2013.01)

(58) Field of Classification Search
CPC ......... H01L 21/52; H01L 24/29; H01L 24/32; H01L 24/83; H01L 25/18; H01L 2224/2929; H01L 2224/29324; H01L 2224/29339; H01L 2224/29347; H01L 2224/29386; H01L 2224/32245; H01L 2224/4385

See application file for complete search history.

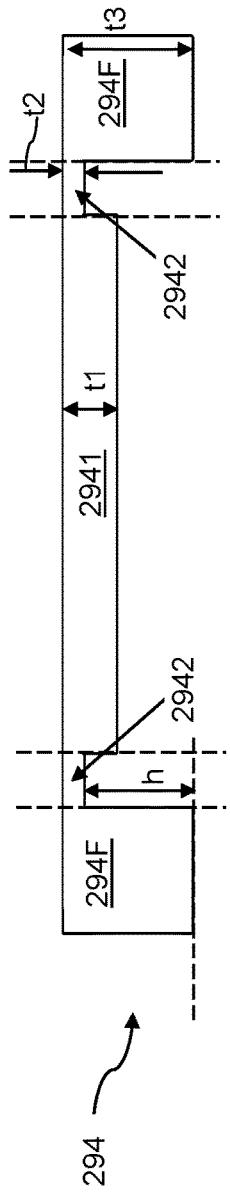
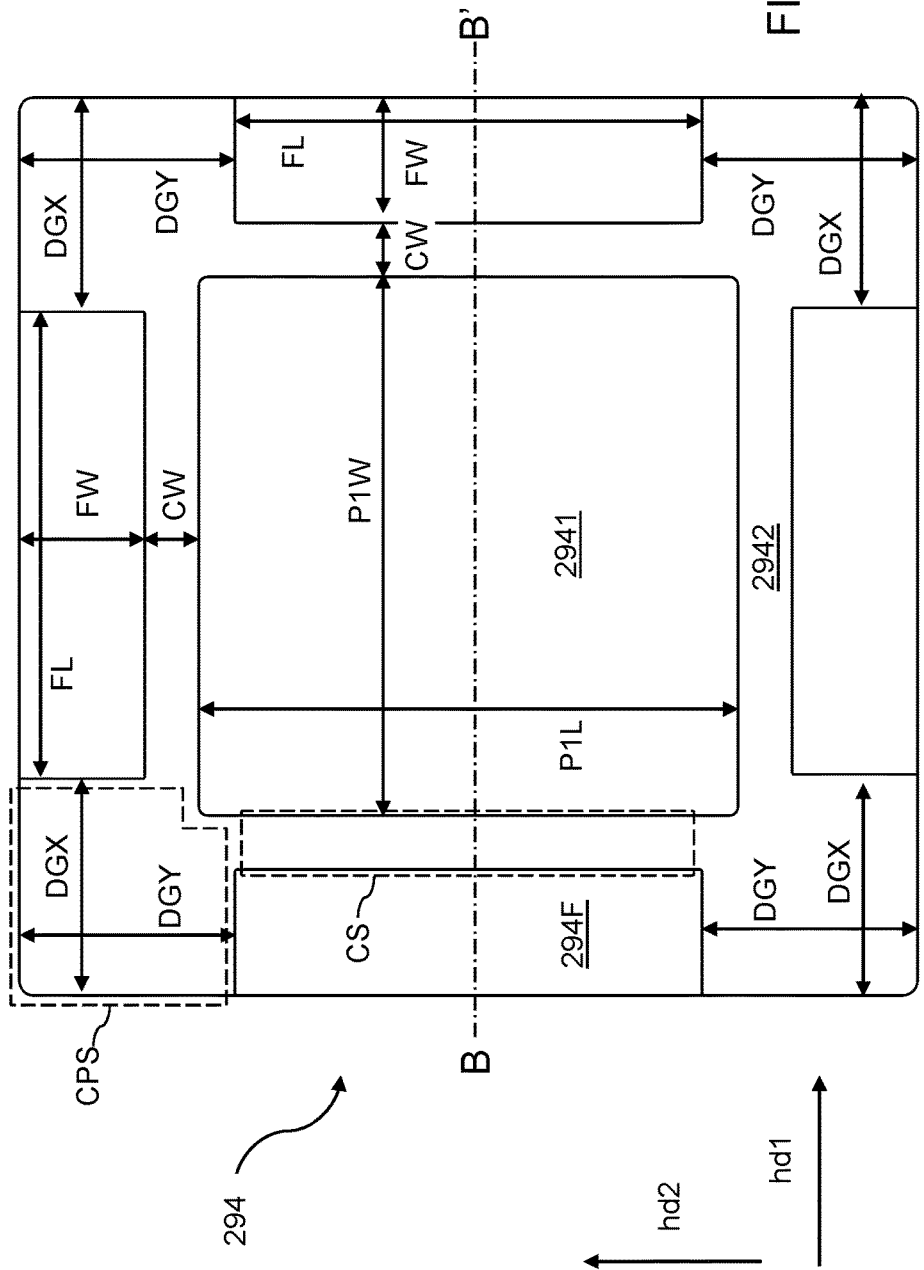
FIG. 13B
FIG. 13A

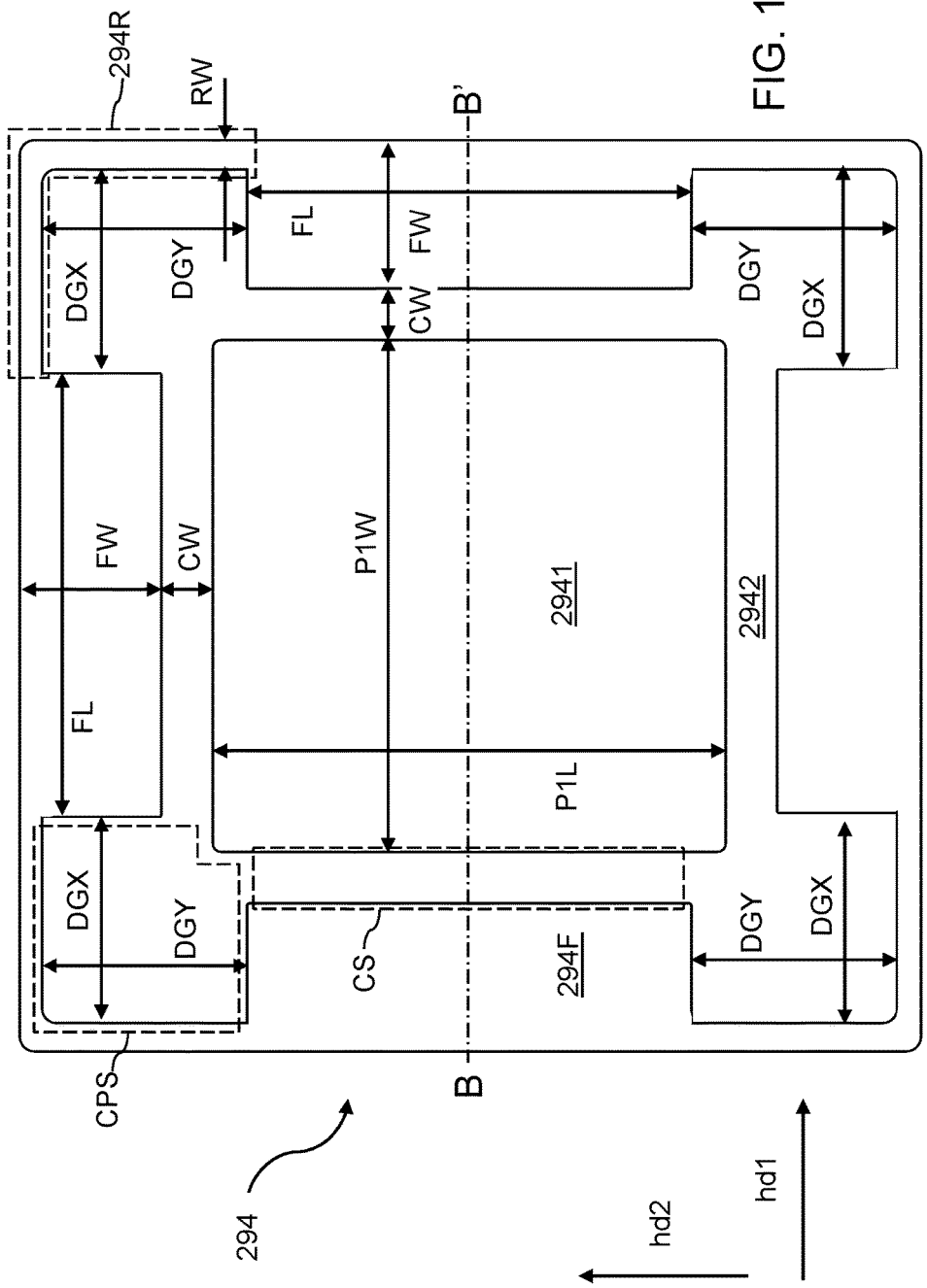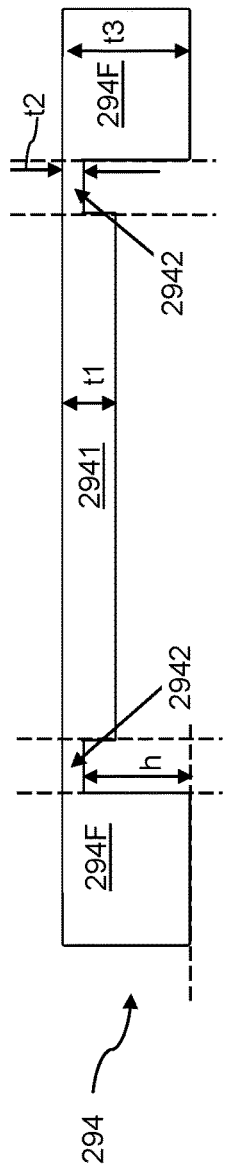

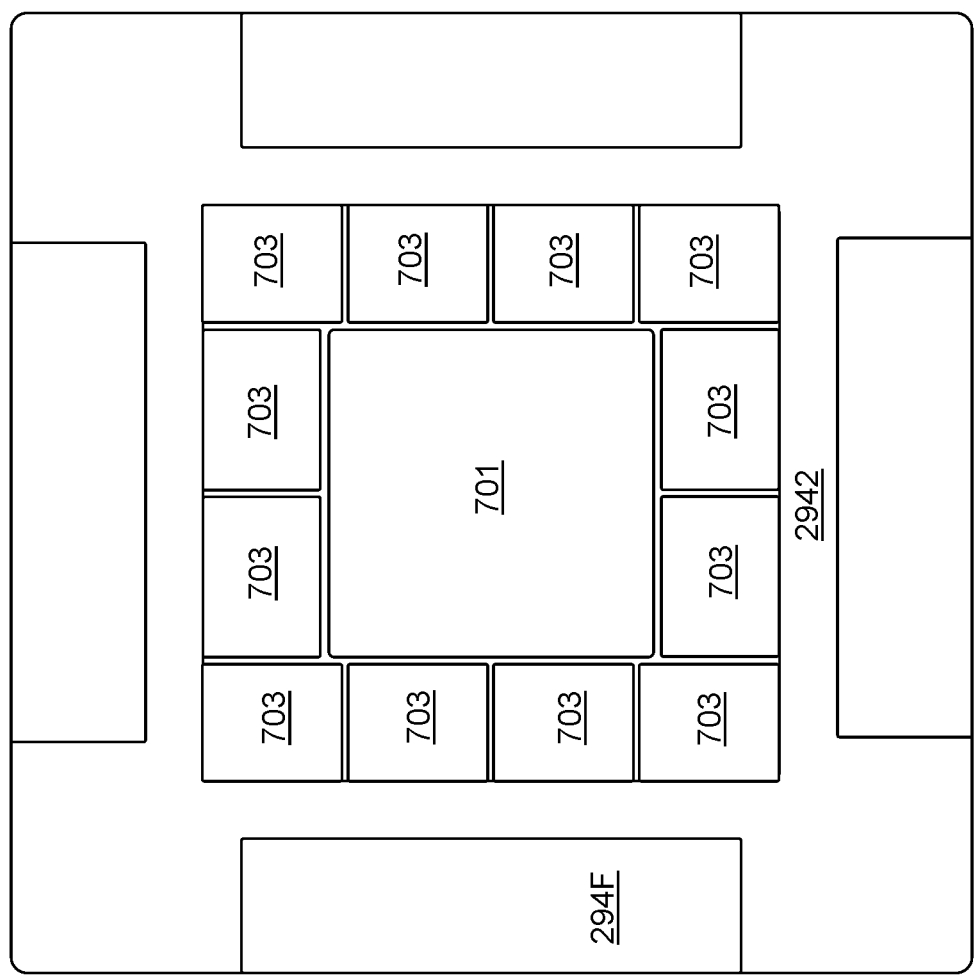
FIG. 17A

INTEGRATED CHIP PACKAGE INCLUDING A CRACK-RESISTANT LID STRUCTURE AND METHODS OF FORMING THE SAME

RELATED APPLICATIONS

This application claims the benefit of priority from U.S. Provisional Application Ser. No. 63/346,277 titled "Novel 3D Integrated Circuit Package for Underfill Crack & Adhesive Delamination Risk Mitigation" and filed on May 26, 2022, the entire contents of which are incorporated herein by reference for all purposes.

BACKGROUND

A lid structure is used in an integrated chip package to increase mechanical stability of an assembly of a packaging substrate, an interposer, and semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13A is a bottom-up view of a first lid structure according to an embodiment of the present disclosure.

FIG. 13B is a vertical cross-sectional view of the first lid structure along the vertical plane B-B' of FIG. 13A.

FIG. 14A is a bottom-up view of a second lid structure according to an embodiment of the present disclosure.

FIG. 14B is a vertical cross-sectional view of the second lid structure along the vertical plane B-B' of FIG. 14A.

FIGS. 15A, 15B, and 15C are vertical cross-sectional views of the first embodiment of the structure. FIG. 15D is a top-down view of the first embodiment of the structure. The vertical plane A-A' in FIG. 15D is a cut plane of the vertical cross-sectional view of FIG. 15A, the vertical plane B-B' in FIG. 15D is a cut plane of the vertical cross-sectional view of FIG. 15B, and the vertical plane C-C' in FIG. 15D is a cut plane of the vertical cross-sectional view of FIG. 15C.

FIGS. 16A, 16B, and 16C are vertical cross-sectional views of the second embodiment of the structure. FIG. 16D is a top-down view of the second embodiment of the structure. The vertical plane A-A' in FIG. 16D is a cut plane of the vertical cross-sectional view of FIG. 16A, the vertical plane B-B' in FIG. 16D is a cut plane of the vertical cross-sectional view of FIG. 16B, and the vertical plane C-C' in FIG. 16D is a cut plane of the vertical cross-sectional view of FIG. 16C.

FIGS. 17A and 17B illustrate alternative semiconductor die arrangements in the first embodiment of the structure in FIGS. 15A-15D in plan views.

DETAILED DESCRIPTION

Figure 1A:
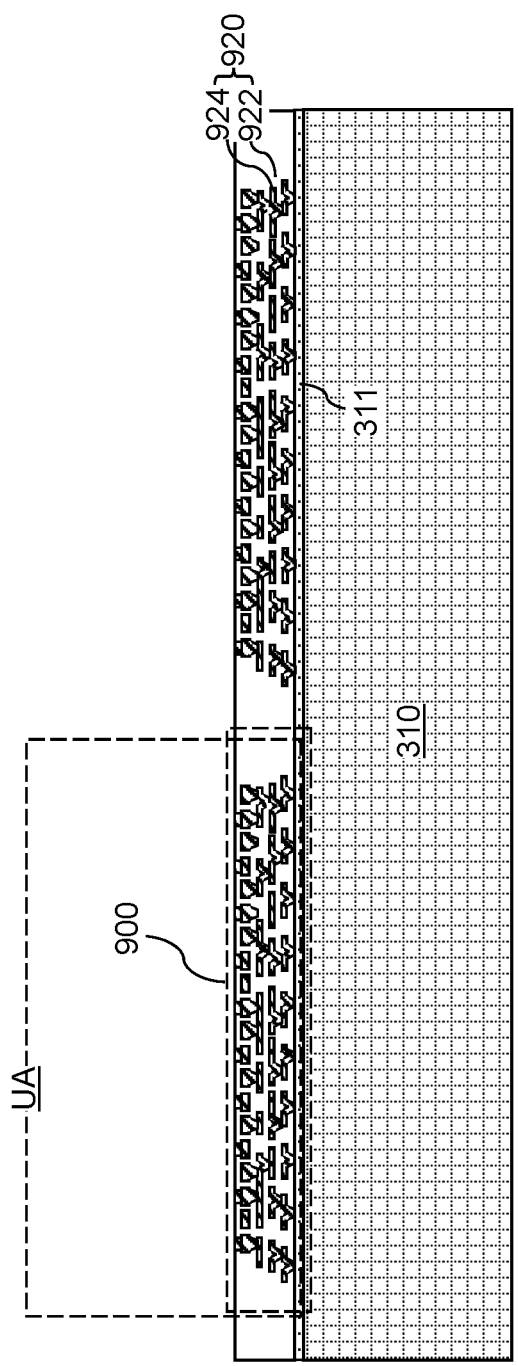
FIG. 1A is a vertical cross-sectional view of a structure that includes a first carrier substrate and redistribution structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to an integrated circuit (IC) packaging process, and more specifically to a chip package structure configured to reduce the risk of mechanical cracks therein. Mechanical cracks in a chip package structure include cracks in underfill material portions, adhesive delamination, thermal interface material delamination, etc. Such mechanical cracks may occur during manufacturing at elevated processing temperatures, during reliability tests, and/or may occur during operation of the device in field applications.

A lid structure may be used to provide mechanical support to a chip package structure. Design changes in the lid structure may result in changes in the overall mechanical stress distribution in a chip package structure. For example, is has been discovered that an increase in the width of foot portions of a lid structures may induce an increase in the frequency of cracks in an underfill material and/or loss of coverage in a thermal interface material. According to an aspect of the present disclosure, lid structures according to embodiments of the present disclosure use a dual thickness plate for a lid structure in order to mitigate the risk of cracks in an underfill material portion and to improve the coverage of the thermal interface material in a chip package structure. The lid structures according to embodiments of the present disclosure also uses foot portions configured to release mechanical stress at package corners by limiting the lateral extent of the foot portions so that the foot portions are located entirely outside of the corner regions of the lid structure. Further, the lid structures may be thinned in a non-interposer projection region that does not have an areal overlap in a top-down view. The pattern of an adhesive material layer may be modified to match the pattern of the foot portions. Further, chip-on-package (COP) structures may be optimized for minimizing cracks in underfill material portions. The various aspects of the present disclosure are now described in detail with reference to accompanying drawings.

Figure 1B:
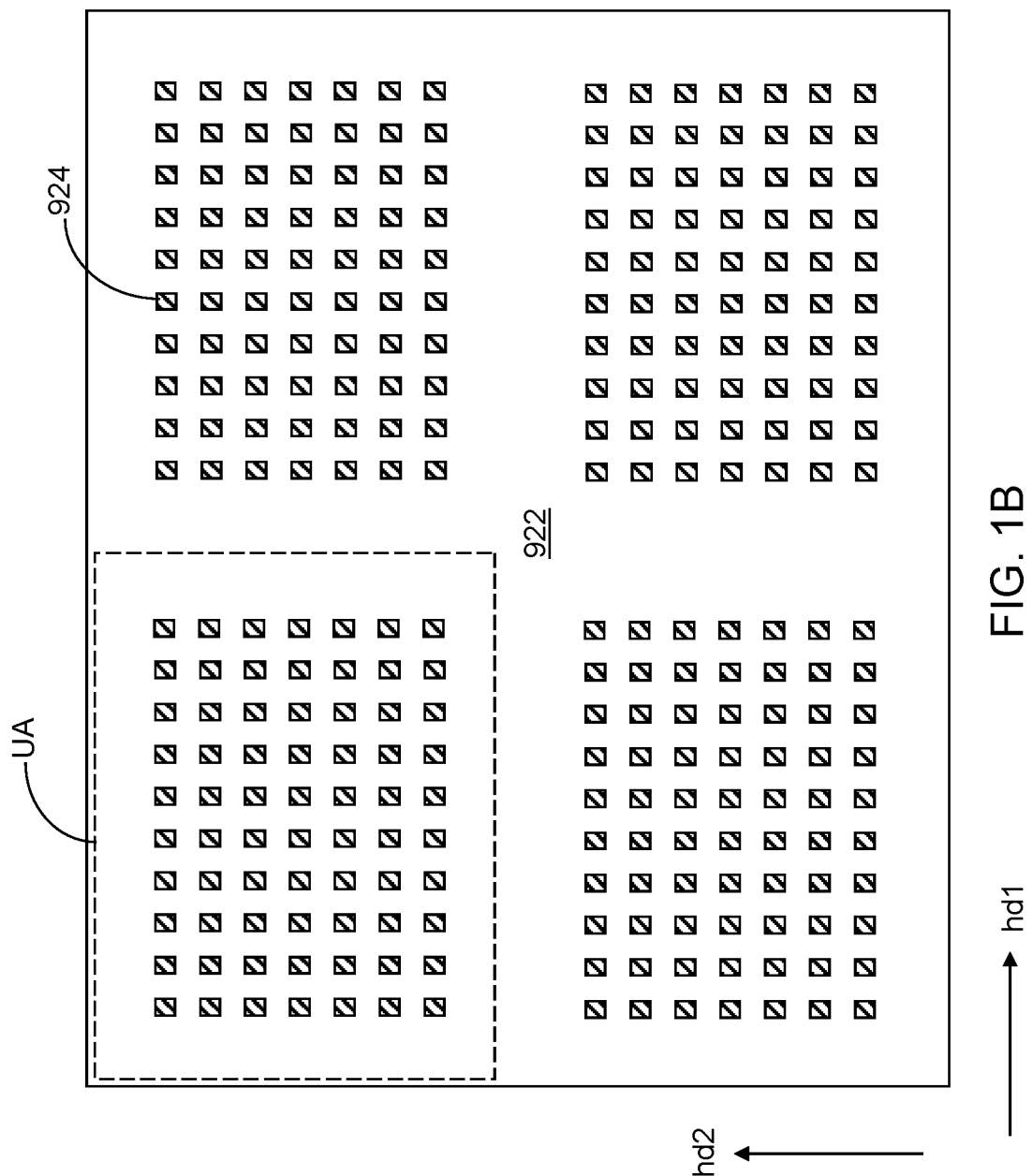
FIG. 1B is a top-down view of the region of the structure of FIG. 1A.

Referring to FIGS. 1A and 1B, a structure according to an embodiment of the present disclosure may include a first carrier substrate 310 and interposers 900 formed on a front side surface of the first carrier substrate 310. The first carrier substrate 310 may include an optically transparent substrate such as a glass substrate or a sapphire substrate. The diameter of the first carrier substrate 310 may be in a range from 150 mm to 290 mm, although lesser and greater diameters may be used. In addition, the thickness of the first carrier substrate 310 may be in a range from 500 microns to 2,000 microns, although lesser and greater thicknesses may also be used. Alternatively, the first carrier substrate 310 may be provided in a rectangular panel format. The dimensions of the first carrier in such alternative embodiments may be substantially the same.

A first adhesive layer 311 may be applied to the front-side surface of the first carrier substrate 310. In one embodiment, the first adhesive layer 311 may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. Alternatively, the first adhesive layer 311 may include a thermally decomposing adhesive material. For example, the first adhesive layer 311 may include an acrylic pressure-sensitive adhesive that decomposes at an elevated temperature. The debonding temperature of the thermally decomposing adhesive material may be in a range from 150 degrees to 200 degrees Celsius.

Interposers 900 may be formed over the first adhesive layer 311. Specifically, an interposer 900 may be formed within each unit area UA, which is the area of a repetition unit that may be repeated in a two-dimensional array over the first carrier substrate 310. Each interposer 900 includes a respective portion of a redistribution structure 920, which is a combination of redistribution dielectric layers 922 and redistribution wiring interconnects 924. The redistribution dielectric layers 922 are dielectric materials embedding the redistribution wiring interconnects 924. The redistribution dielectric layers 922 may be referred to as first dielectric layers or second dielectric layers in the claims of the instant application. The redistribution dielectric layers 922 include a respective dielectric polymer material such as polyimide (PI), benzocyclobutene (BCB), or polybenzobisoxazole (PBO). Other suitable materials may be within the contemplated scope of disclosure. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

The redistribution wiring interconnects 924 are metallic connection structures, i.e., metallic structures that provide electrical connection. The redistribution wiring interconnects 924 may be referred to as first metallic connection structures or second metallic connection structures in the claims of the instant application. Each of the redistribution wiring interconnects 924 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have a thickness in a range from 50 nm to 500 nm, and the copper seed layer may have a thickness in a range from 50 nm to 500 nm. The metallic fill material for the redistribution wiring interconnects 924 may include copper, nickel, or copper and nickel. Other suitable metallic fill materials are within the contemplated scope of disclosure. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each interposer 900 (i.e., the levels of the redistribution wiring interconnects 924) may be in a range from 1 to 10. A periodic two-dimensional array (such as a rectangular array) of interposers 900 may be formed over the first carrier substrate 310. Each interposer 900 may be formed within a unit area UA. The layer including all interposers 900 is herein referred to as an interposer layer. The interposer layer includes a two-dimensional array of interposers 900. In one embodiment, the two-dimensional array of interposers 900 may be a rectangular periodic two-dimensional array of interposers 900 having a first periodicity along a first horizontal direction hd1 and having a second periodicity along a second horizontal direction hd2 that is perpendicular to the first horizontal direction hd1.

Figure 2A:
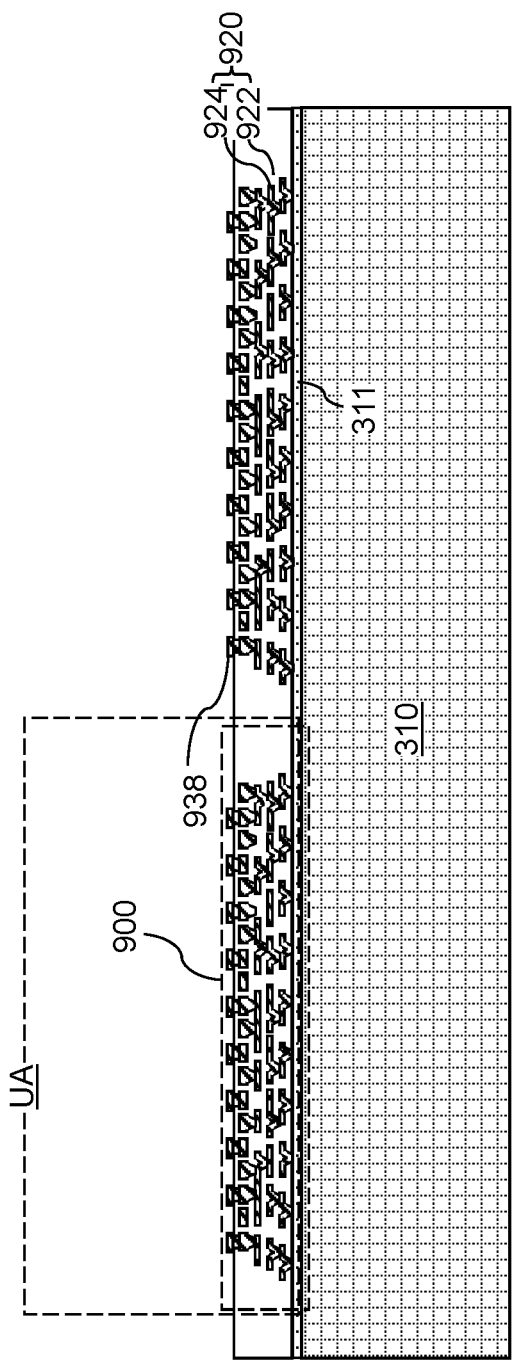
FIG. 2A is vertical cross-sectional view of a region of the structure after formation of interposer-side bump structures according to an embodiment of the present disclosure.
Figure 2B:
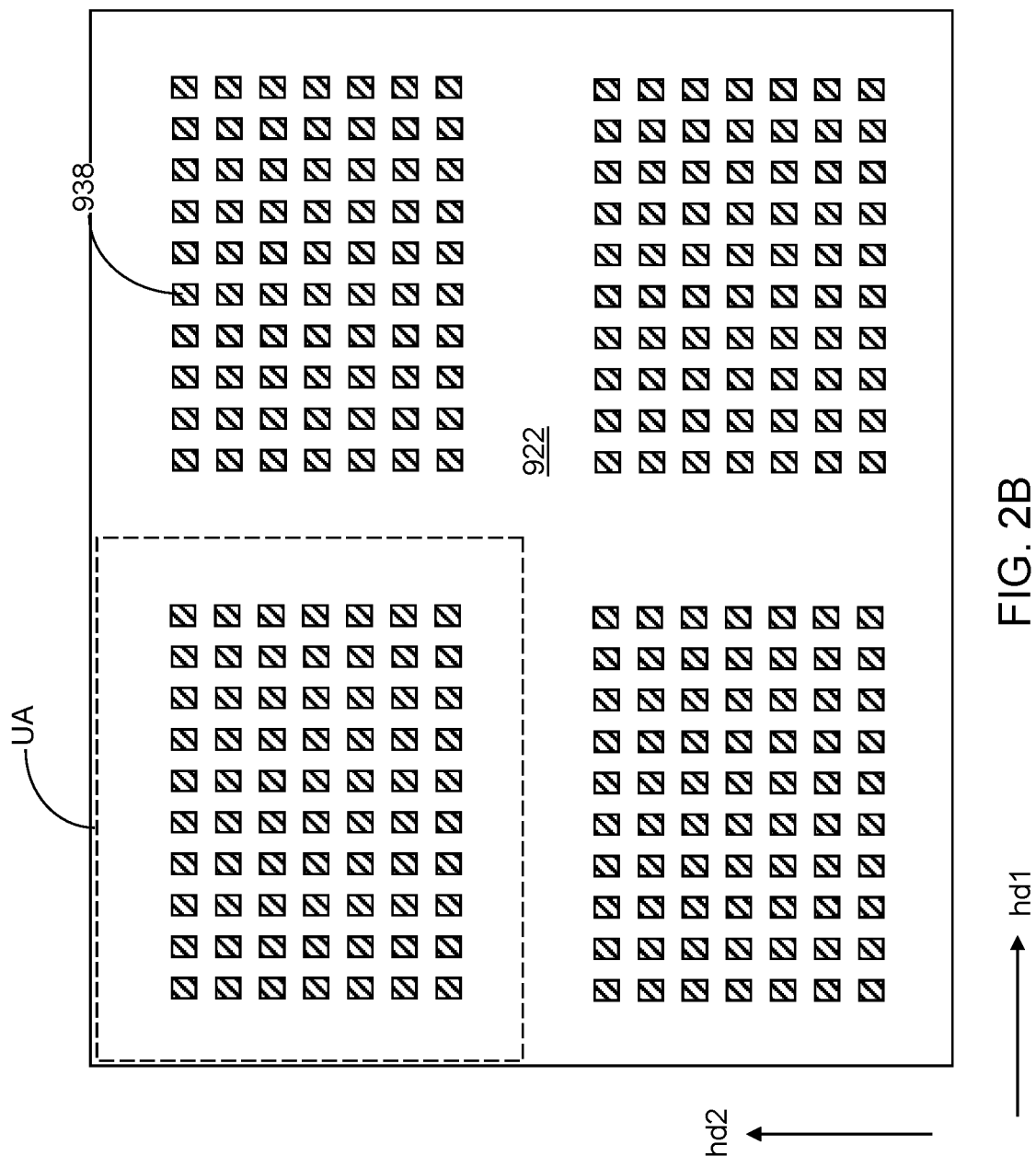
FIG. 2B is a top-down view of the region of the structure of FIG. 2A.

Referring to FIGS. 2A and 2B, at least one array of interposer-side bump structures 938 may be formed on the front surface of each interposer 900, i.e., with a portion of the redistribution structure 920 located within a respective unit area UA. A single array of interposer-side bump structures 938, or a plurality of arrays of interposer-side bump structures 938, may be formed on each interposer 900. In one embodiment, each array of interposer-side bump structures 938 may be formed as a respective periodic array such as a rectangular array.

Figure 3A:
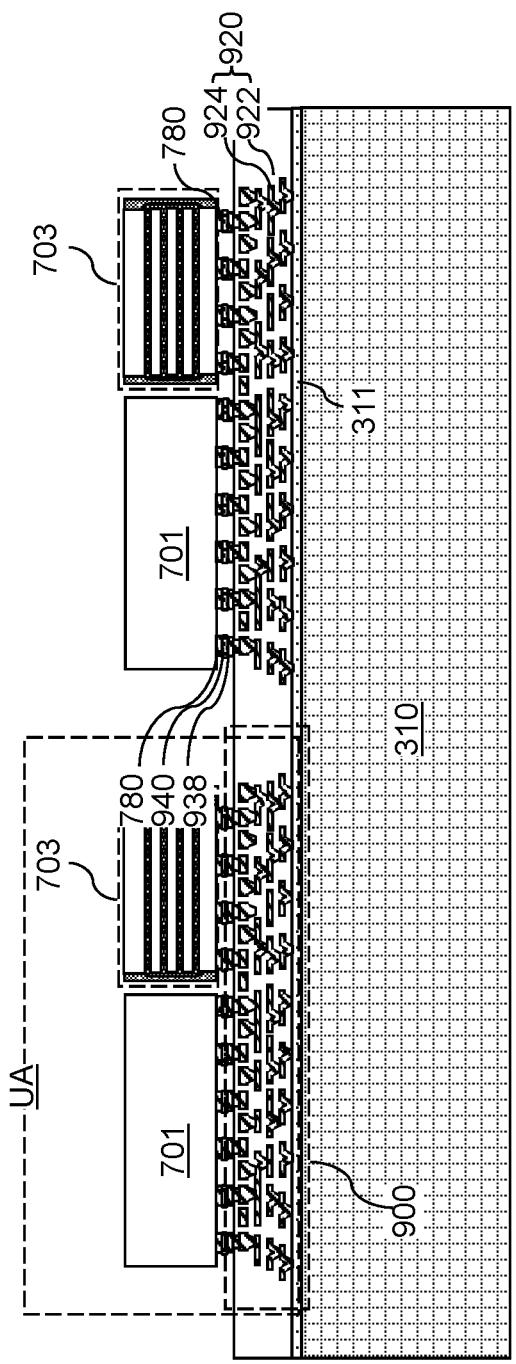
FIG. 3A is a vertical cross-sectional view of a region the structure after attaching semiconductor dies according to an embodiment of the present disclosure.
Figure 3B:
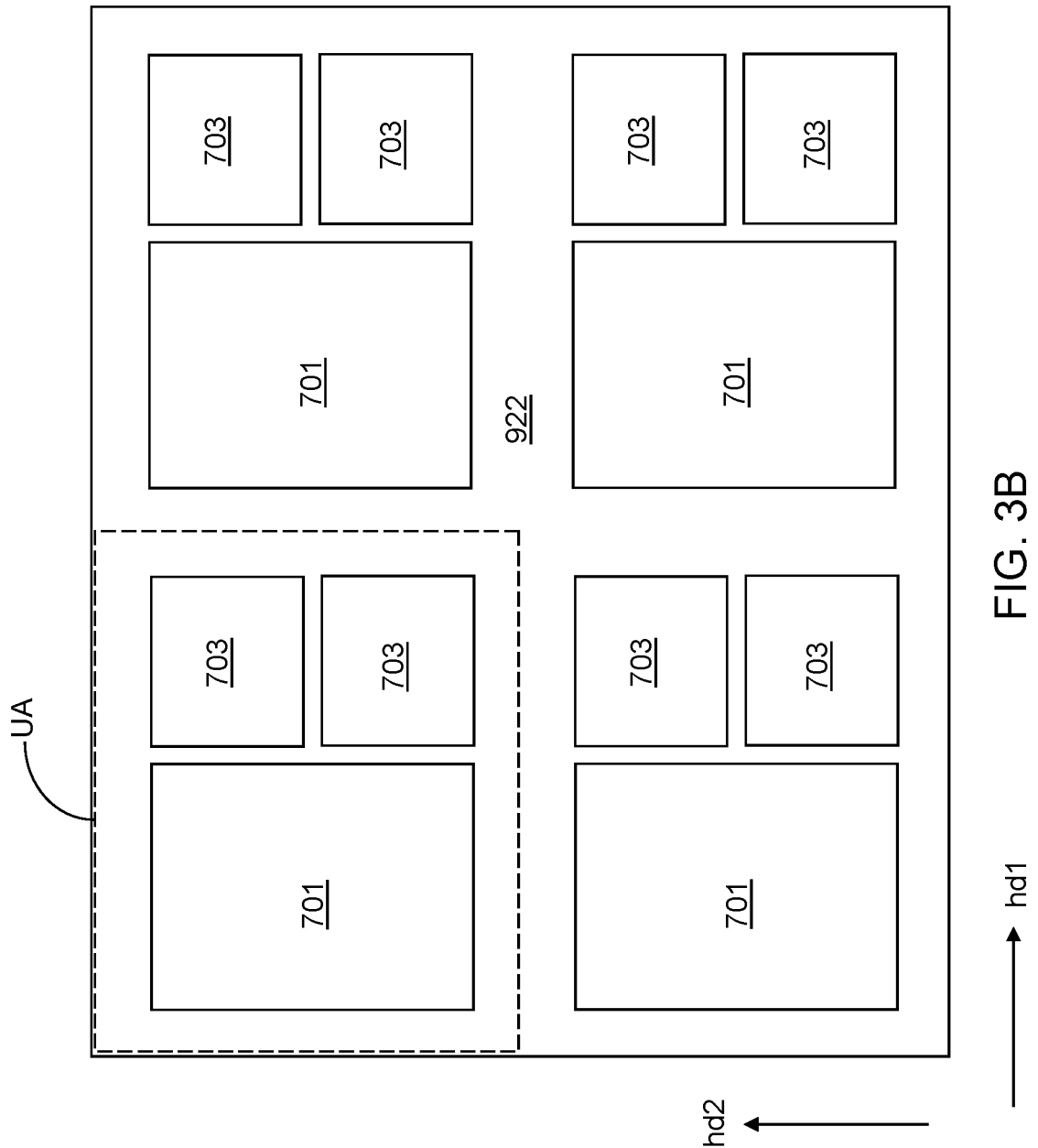
FIG. 3B is a top-down view of the region of the structure of FIG. 3A.

Referring to FIGS. 3A and 3B, a set of at least one semiconductor die (701, 703) may be bonded to each redistribution structure 920. In one embodiment, the redistribution structures 920 may be arranged as a two-dimensional periodic array, and multiple sets of at least one semiconductor die (701, 703) may be bonded to the redistribution structures 920 as a two-dimensional periodic rectangular array of sets of the at least one semiconductor die (701, 703). Each set of at least one semiconductor die (701, 703) includes at least one semiconductor die. Each set of at least one semiconductor die (701, 703) may include any set of at least one semiconductor die known in the art. In one embodiment, each set of at least one semiconductor die (701, 703) may comprise a plurality of semiconductor dies (701, 703). For example, each set of at least one semiconductor die (701, 703) may include at least one system-on-chip (SoC) die 701 and/or at least one memory die 703. Each SoC die 701 may comprise an application processor die, a central processing unit die, or a graphic processing unit die. In one embodiment, the at least one memory die 703 may comprise a high bandwidth memory (HBM) die that includes a vertical stack of static random access memory dies. In one embodiment, the at least one semiconductor die (701, 703) may include at least one system-on-chip (SoC) die and a high bandwidth memory (HBM) die including a vertical stack of static random access memory (SRAM) dies that are interconnected to one another through microbumps and are laterally surrounded by an epoxy molding material enclosure frame.

Each semiconductor die (701, 703) may comprise a respective array of die-side bump structures 780. Each of the semiconductor dies (701, 703) may be positioned in a face-down position such that die-side bump structures 780 face the first solder material portions 940. Each set of at least one semiconductor die (701, 703) may be placed within a respective unit area UA. Placement of the semiconductor dies (701, 703) may be performed using a pick and place apparatus such that each of the die-side bump structures 780 may be placed on a top surface of a respective one of the first solder material portions 940.

Generally, a redistribution structure 920 including interposer-side bump structures 938 thereupon may be provided, and at least one semiconductor die (701, 703) including a respective set of die-side bump structures 780 may be provided. The at least one semiconductor die (701, 703) may be bonded to the redistribution structure 920 using first solder material portions 940 that are bonded to a respective interposer-side bump structure 938 and to a respective one of the die-side bump structures 780.

Each set of at least one semiconductor die (701, 703) may be attached to a respective redistribution structure 920 through a respective set of first solder material portions 940. Each of the at least one cushioning film within a unit area UA may be located outside an area including the at least one semiconductor die (701, 703) in the unit area UA in a plan view. The plan view is a view along a vertical direction, which is the direction that is perpendicular to the planar top surface of the redistribution structure layer.

Figure 3C:
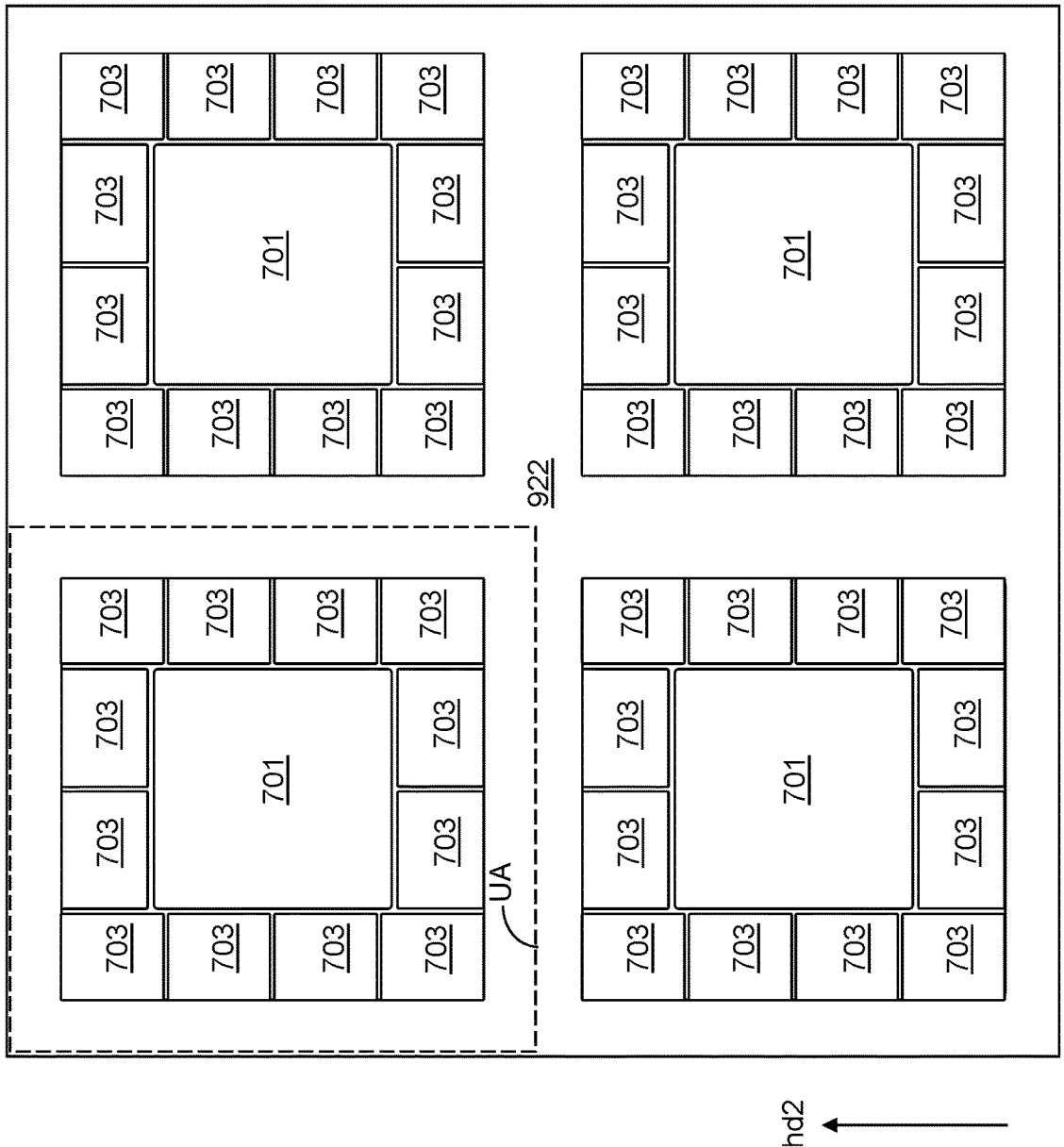
FIG. 3C is a top-down view of a region of an alternative configuration of the structure of FIG. 3A.
Figure 3D:
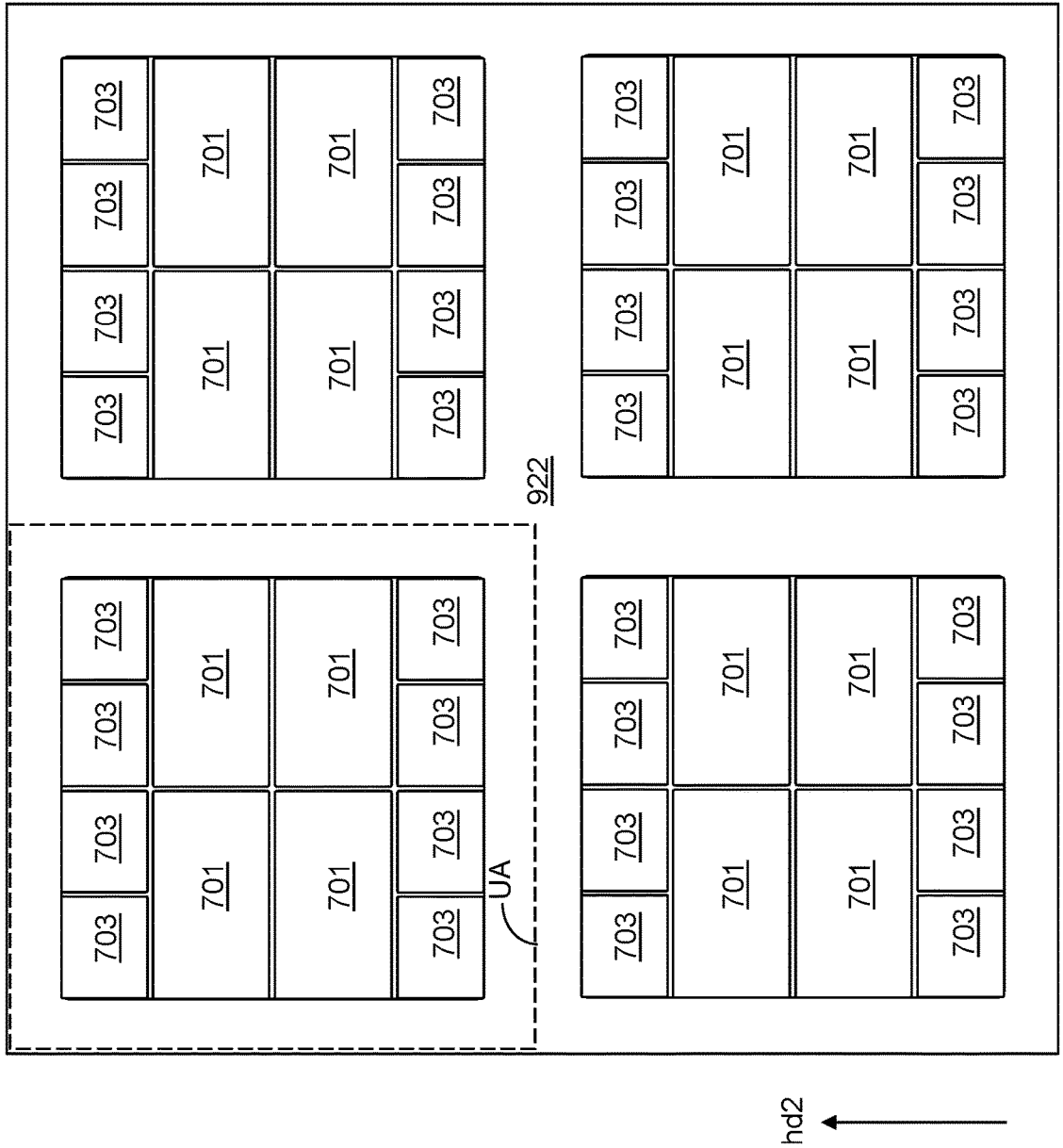
FIG. 3D is a top-down view of a region of another alternative configuration of the structure of FIG. 3A.

FIG. 3C is a top-down view of a region of an alternative configuration of the structure of FIG. 3A. FIG. 3D is a top-down view of a region of another alternative configuration of the structure of FIG. 3A. The configurations illustrated in FIGS. 3C and 3D are merely illustrative, and any arrangement of semiconductor dies (701, 703) may be employed. Generally, a plurality of semiconductor dies (701, 703) may be attached to each interposer 900. In one embodiment, the plurality of semiconductor dies (701, 703) may comprise at least one SoC die 701 and at least one memory die 703. In one embodiment, each plurality of semiconductor dies (701, 703) attached to a respective interposer 900 may be arranged within a respective rectangular area such that sidewalls of a subset of the respective plurality of semiconductor dies (701, 703) are located at the four sides of the respective rectangular are.

Figure 3E:
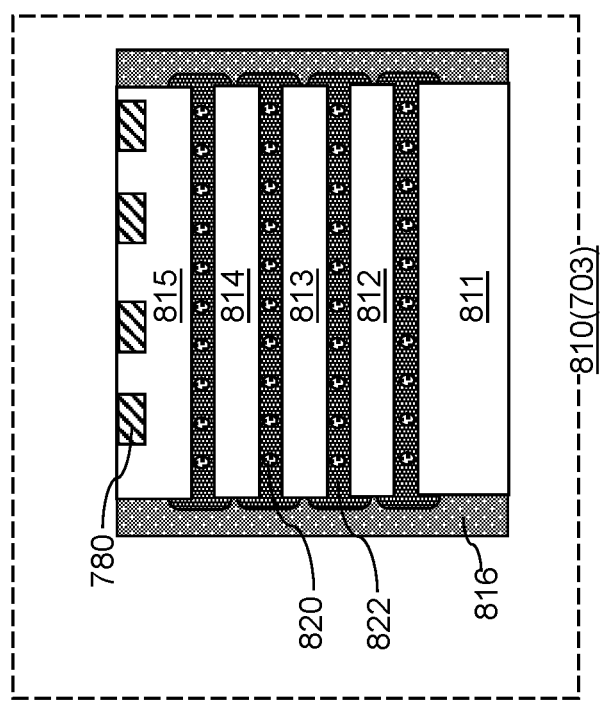
FIG. 3E is a magnified vertical cross-sectional view of a high bandwidth memory die.

Referring to FIG. 3E, a high bandwidth memory (HBM) die 810 is illustrated, which may be used as a memory die 703 within the structures of FIGS. 6A and 6B. The HBM die 810 may include a vertical stack of static random access memory dies (811, 812, 813, 814, 815) that are interconnected to one another through microbumps 820 and are laterally surrounded by an epoxy molding material enclosure frame 816. The gaps between vertically neighboring pairs of the random access memory dies (811, 812, 813, 814, 815) may be filled with a HBM underfill material portions 822 that laterally surrounds a respective set of microbumps 820. The HBM die 810 may comprise an array of die-side bump structures 780 configured to be bonded to a subset of an array of interposer-side bump structures 938 within a unit area UA. The HBM die 810 may, or may not, be configured to provide a high bandwidth as defined under JEDEC standards, i.e., standards defined by The JEDEC Solid State Technology Association.

Figure 4:
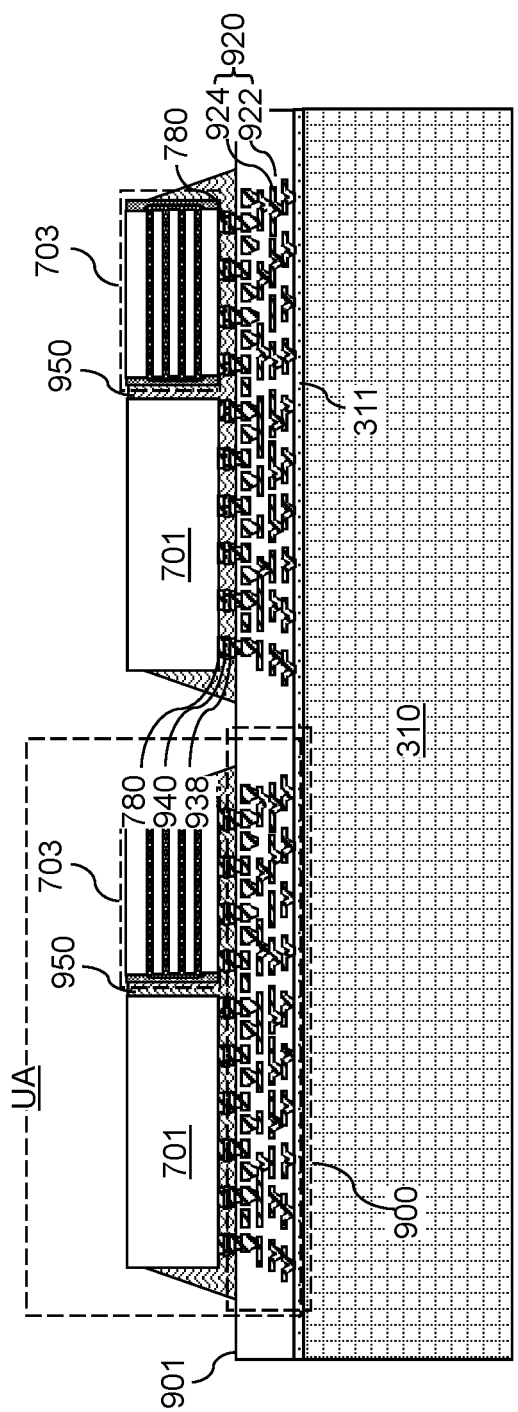
FIG. 4 is a vertical cross-sectional view of the structure after formation of first underfill material portions.

Referring to FIG. 4, a first underfill material may be applied into each gap between the interposers 900 and sets of at least one semiconductor die (701, 703) that are bonded to the interposers 900. The first underfill material may comprise any underfill material known in the art. A first underfill material portion 950 may be formed within each unit area UA between an interposer 900 and an overlying set of at least one semiconductor die (701, 703). The first underfill material portions 950 may be formed by injecting the first underfill material around a respective array of first solder material portions 940 in a respective unit area UA. Any known underfill material application method may be used, which may be, for example, the capillary underfill method, the molded underfill method, or the printed underfill method.

Within each unit area UA, a first underfill material portion 950 may laterally surround, and contact, each of the first solder material portions 940 within the unit area UA. The first underfill material portion 950 may be formed around, and contact, the first solder material portions 940, the on-interposer bump structure 938, and the on-die bump structures 780 in the unit area UA. The first underfill material portion 950 is formed between semiconductor dies (701, 703) and an interposer 900, and thus, is also referred to as a die-interposer underfill material portion, or a DI underfill material portion.

Each interposer 900 in a unit area UA comprises on-interposer bump structure 938. At least one semiconductor die (701, 703) comprising a respective set of on-die bump structures 780 is attached to the on-interposer bump structure 938 through a respective set of first solder material portions 940 within each unit area UA. Within each unit area UA, a first underfill material portion 950 laterally surrounds the on-interposer bump structure 938 and the on-die bump structures 780 of the at least one semiconductor die (701, 703).

Generally, an underfill material portion 950 may be formed between each facing pair of the at least one interposer 900 and at least one set of the at least one semiconductor die (701, 703). In one embodiment, each interposer 900 comprises on-interposer bump structures 938 located above the horizontal plane including the first horizontal surface 901 of the interposer 900, and the horizontally-extending portion of the underfill material portion 950 is located above the horizontal plane including the first horizontal surface 901 of the interposer 900.

Figure 5A:
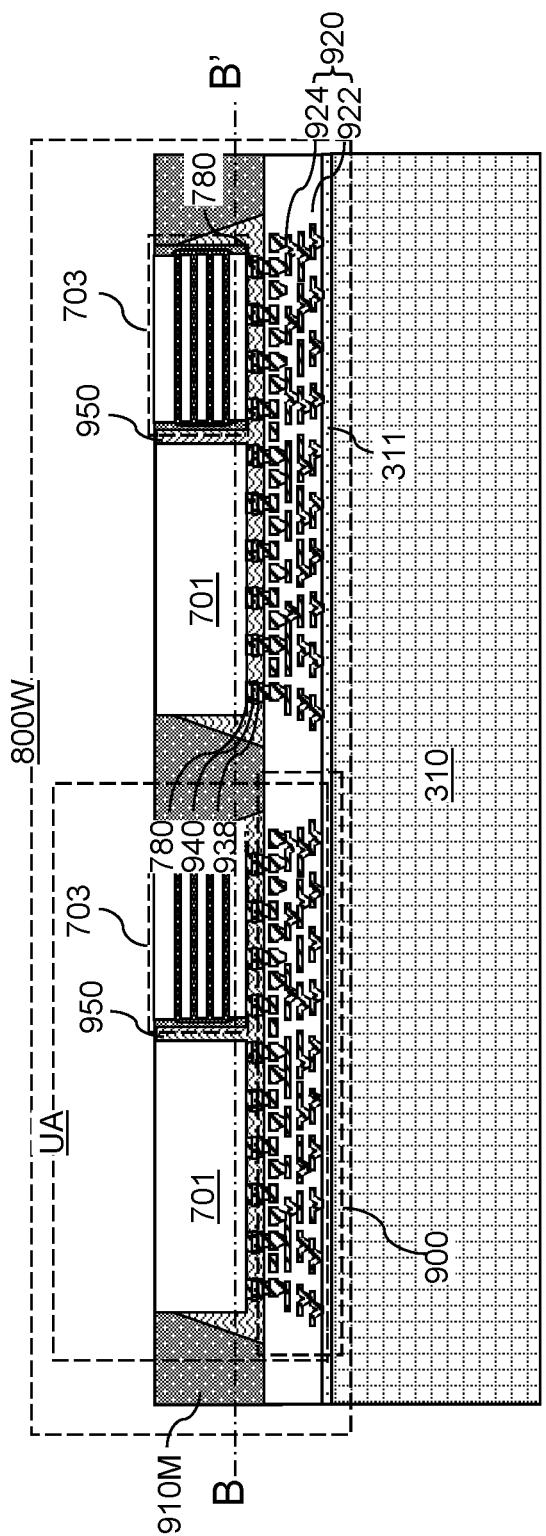
FIG. 5A is a vertical cross-sectional view of the structure after formation of an epoxy molding compound (EMC) matrix according to an embodiment of the present disclosure.
Figure 5B:
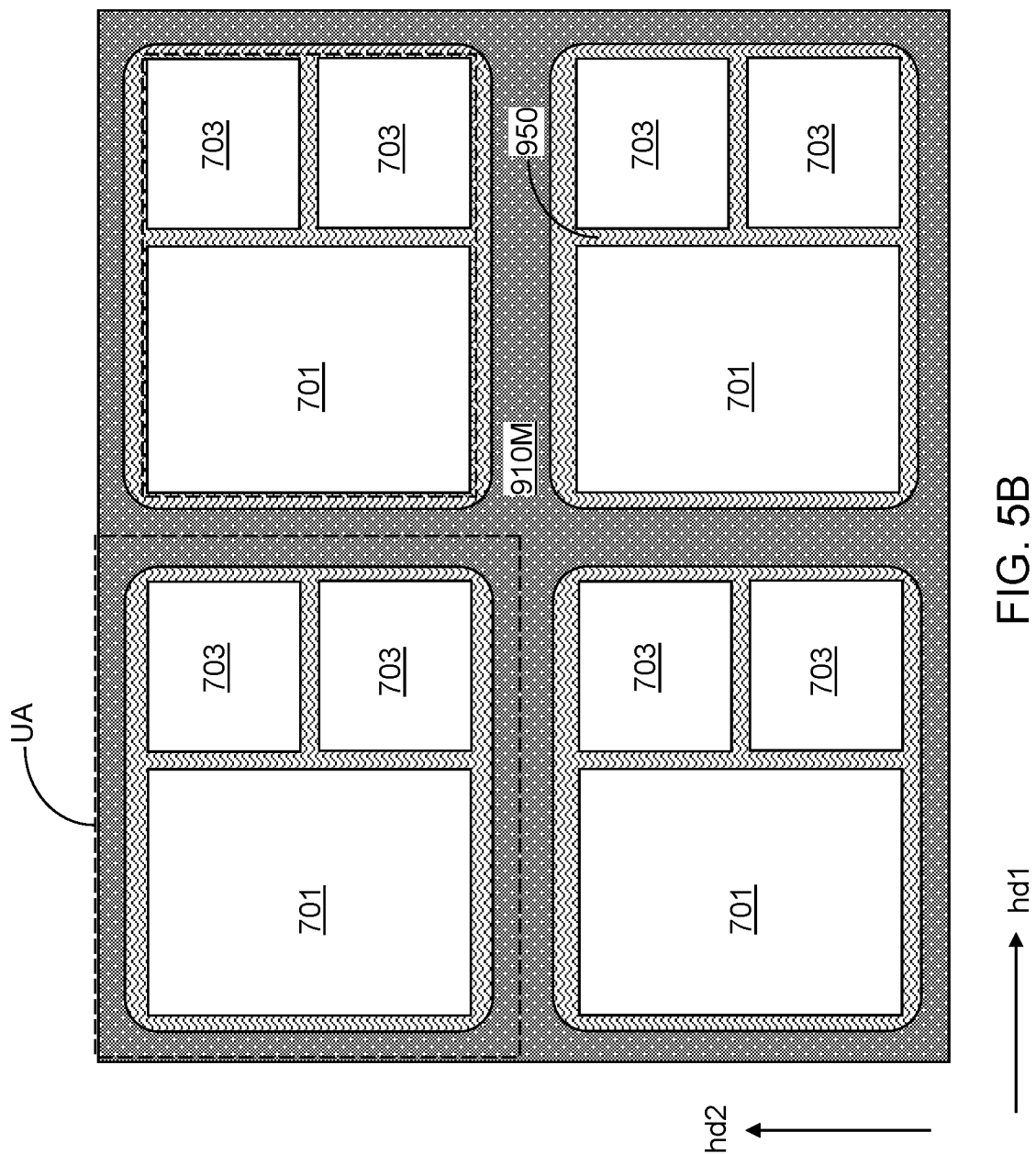
FIG. 5B is a horizontal cross-sectional view of the structure along the horizontal plane B-B' of FIG. 5A.

Referring to FIGS. 5A and 5B, an epoxy molding compound (EMC) may be applied to the gaps between contiguous assemblies of a respective set of semiconductor dies (701, 703) and a first underfill material portion 950.

The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the first adhesive layer 311 in embodiments in which the adhesive layer includes a thermally debonding material. For example, the curing temperature of the EMC may be in a range from 125° C. to 150° C.

The EMC may be cured at a curing temperature to form an EMC matrix 910M that laterally surrounds and embeds each assembly of a set of semiconductor dies (701, 703) and a first underfill material portion 950. The EMC matrix 910M includes a plurality of epoxy molding compound (EMC) die frames that may be laterally adjoined to one another. Each EMC die frame is a portion of the EMC matrix 910M that is located within a respective unit area UA. Thus, each EMC die frame laterally surrounds and embeds a respective a set of semiconductor dies (701, 703) and a respective first underfill material portion 950. Young's modulus of pure epoxy is about 3.35 GPa, and Young's modulus of the EMC may be higher than Young's modulus of pure epoxy by adding additives. Young's modulus of EMC may be greater than 3.5 GPa.

Portions of the EMC matrix 910M that overlies the horizontal plane including the top surfaces of the semiconductor dies (701, 703) may be removed by a planarization process. For example, the portions of the EMC matrix 910M that overlies the horizontal plane may be removed using a chemical mechanical planarization (CMP). The combination of the remaining portion of the EMC matrix 910M, the semiconductor dies (701, 703), the first underfill material portions 950, and the two-dimensional array of interposers 900 comprises a reconstituted wafer 800W. Each portion of the EMC matrix 910M located within a unit area UA constitutes an EMC die frame.

Figure 6:
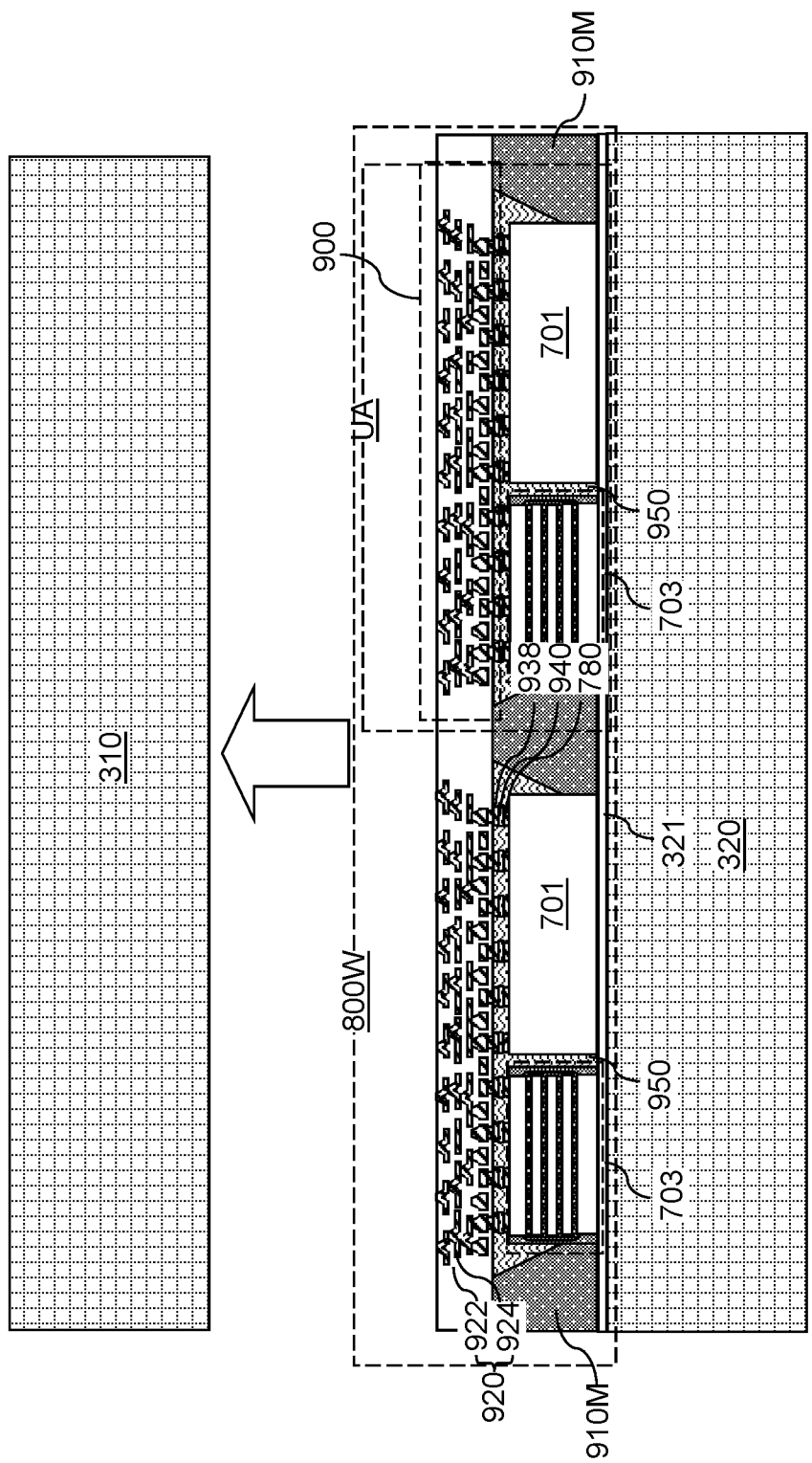
FIG. 6 is a vertical cross-sectional view of a region of the structure after attaching a second carrier substrate and detaching the first carrier substrate according to an embodiment of the present disclosure.

Referring to FIG. 6, a second adhesive layer 321 may be applied to the physically exposed planar surface of the reconstituted wafer 800W, i.e., the physically exposed surfaces of the EMC matrix 910M, the semiconductor dies (701, 703), and the first underfill material portions 950. In one embodiment, the second adhesive layer 321 may comprise a same material as, or may comprise a different material from, the material of the first adhesive layer 311. In embodiments in which the first adhesive layer 311 comprises a thermally decomposing adhesive material, the second adhesive layer 321 may comprise another thermally decomposing adhesive material that decomposes at a higher temperature, or may comprise a light-to-heat conversion material.

A second carrier substrate 320 may be attached to the second adhesive layer 321. The second carrier substrate 320 may be attached to the opposite side of the reconstituted wafer 800W relative to the first carrier substrate 310. Generally, the second carrier substrate 320 may comprise any material that may be used for the first carrier substrate 310. The thickness of the second carrier substrate 320 may be in a range from 500 microns to 2,000 microns, although lesser and greater thicknesses may also be used.

The first adhesive layer 311 may be decomposed by ultraviolet radiation or by a thermal anneal at a debonding temperature. In embodiments in which the first carrier substrate 310 includes an optically transparent material and the first adhesive layer 311 includes an LTHC layer, the first adhesive layer 311 may be decomposed by irradiating ultraviolet light through the transparent carrier substrate. The LTHC layer may be absorb the ultraviolet radiation and generate heat, which decomposes the material of the LTHC layer and cause the transparent first carrier substrate 310 to be detached from the reconstituted wafer 800W. In embodiments in which the first adhesive layer 311 includes a thermally decomposing adhesive material, a thermal anneal process at a debonding temperature may be performed to detach the first carrier substrate 310 from the reconstituted wafer 800W.

Figure 7:
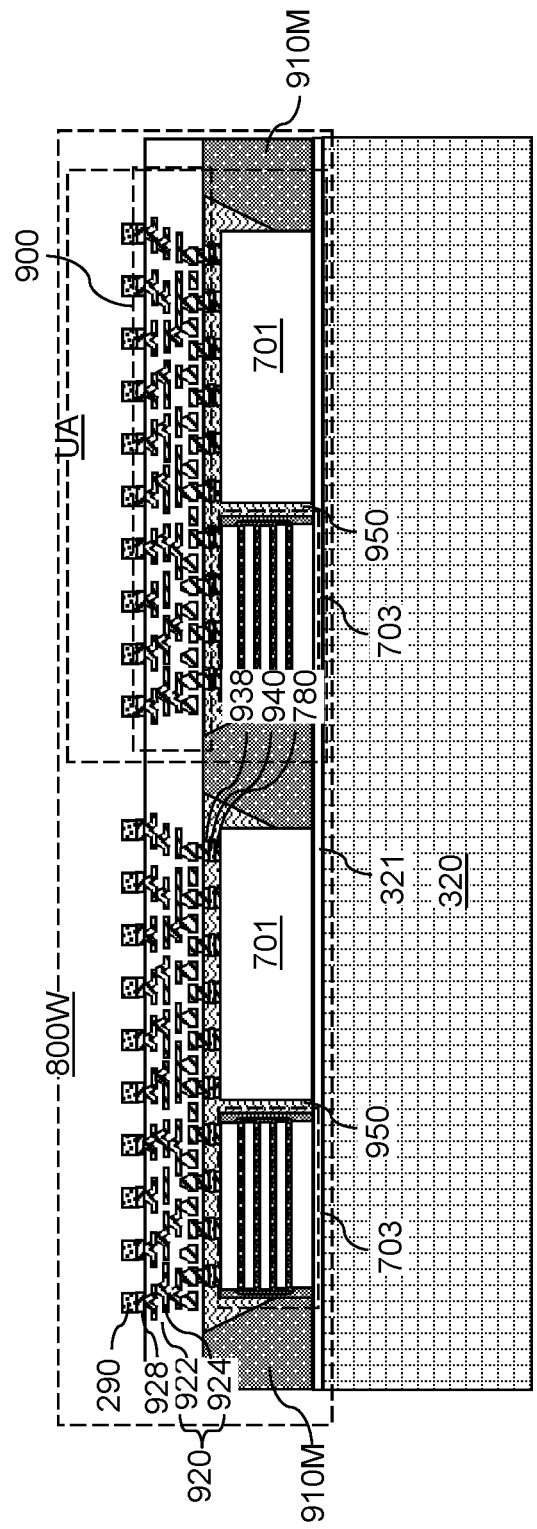
FIG. 7 is a vertical cross-sectional view of a region of the structure after formation of fan-out bonding pads and second solder material portions according to an embodiment of the present disclosure.

Referring to FIG. 7, fan-out bonding pads 928 and second solder material portions 290 may be formed by depositing and patterning a stack of at least one metallic material that may function as metallic bumps and a solder material layer. The metallic fill material for the fan-out bonding pads 928 may include copper. Other suitable materials are within the contemplated scope of disclosure. The thickness of the fan-out bonding pads 928 may be in a range from 5 microns to 100 microns, although lesser or greater thicknesses may also be used. The fan-out bonding pads 928 and the second solder material portions 290 may have horizontal cross-sectional shapes of rectangles, rounded rectangles, or circles. Other suitable shapes are within the contemplated scope of disclosure. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. In some embodiments, the fan-out bonding pads 928 may be, or include, under bump metallurgy (UBM) structures. The configurations of the fan-out bonding pads 928 are not limited to be fan-out structures. Alternatively, the fan-out bonding pads 928 may be configured for microbump bonding (i.e., C2 bonding), and may have a thickness in a range from 30 microns to 100 microns, although lesser or greater thicknesses may also be used. In such an embodiment, the fan-out bonding pads 928 may be formed as an array of microbumps (such as copper pillars) having a lateral dimension in a range from 10 microns to 25 microns, and having a pitch in a range from 20 microns to 50 microns.

The fan-out bonding pads 928 and the second solder material portions 290 may be formed on the opposite side of the EMC matrix 910M and the two-dimensional array of sets of semiconductor dies (701, 703) relative to the interposer layer. The interposer layer includes a three-dimensional array of interposers 900. Each interposer 900 may be located within a respective unit area UA. Each interposer 900 may include redistribution dielectric layers 922, redistribution wiring interconnects 924 embedded in the redistribution dielectric layers 922, and fan-out bonding pads 928. The fan-out bonding pads 928 may be located on an opposite side of the on-interposer bump structure 938 relative to the redistribution dielectric layers 922, and may be electrically connected to a respective one of the on-interposer bump structure 938.

Figure 8:
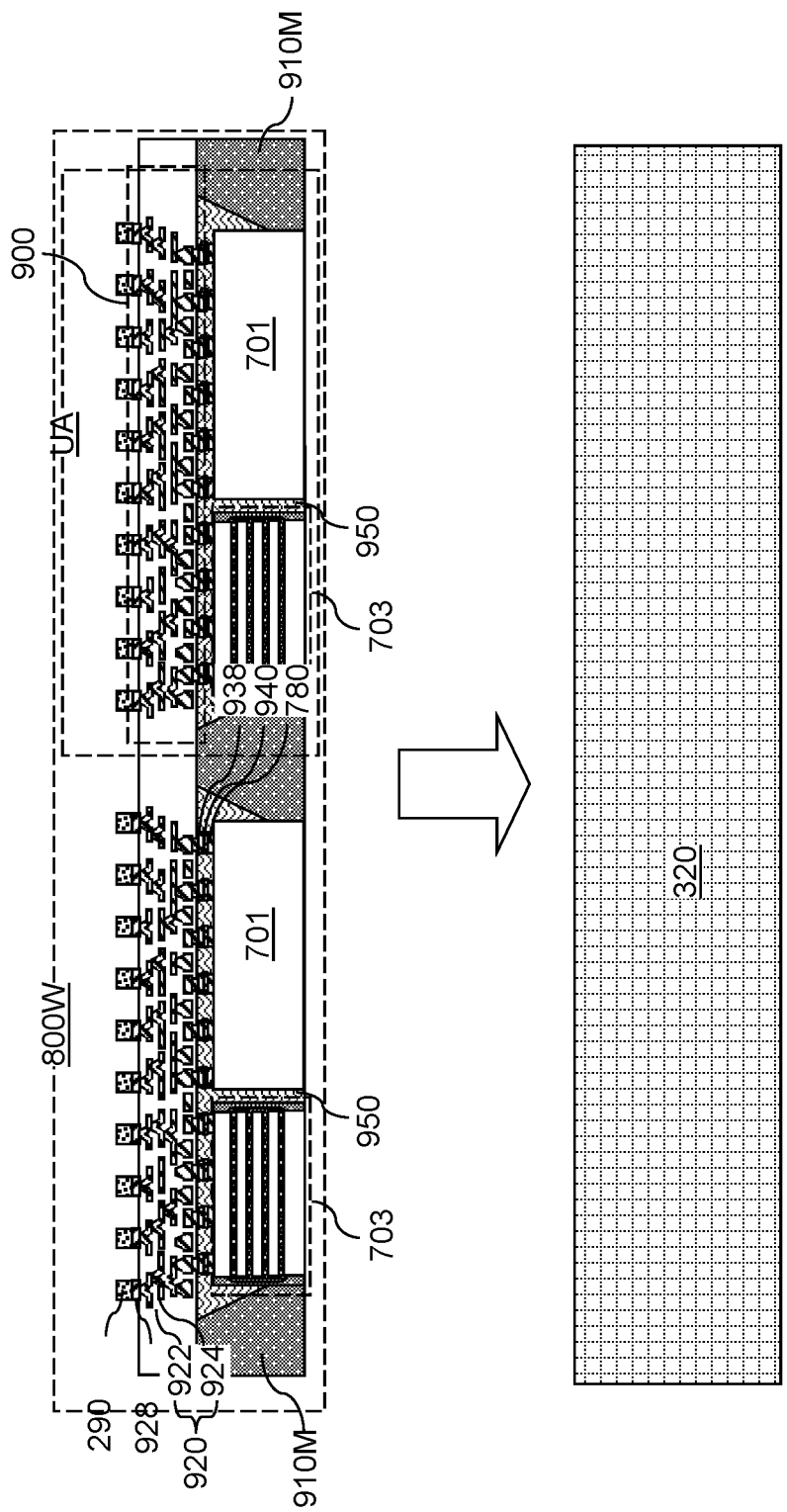
FIG. 8 is a vertical cross-sectional view of a region of the structure after detaching the second carrier substrate according to an embodiment of the present disclosure.

Referring to FIG. 8, the second adhesive layer 321 may be decomposed by ultraviolet radiation or by a thermal anneal at a debonding temperature. In embodiments in which the second carrier substrate 320 includes an optically transparent material and the second adhesive layer 321 includes an LTHC layer, the second adhesive layer 321 may be decomposed by irradiating ultraviolet light through the transparent carrier substrate. In embodiments in which the second adhesive layer 321 includes a thermally decomposing adhesive material, a thermal anneal process at a debonding temperature may be performed to detach the second carrier substrate 320 from the reconstituted wafer 800W.

Figure 9:
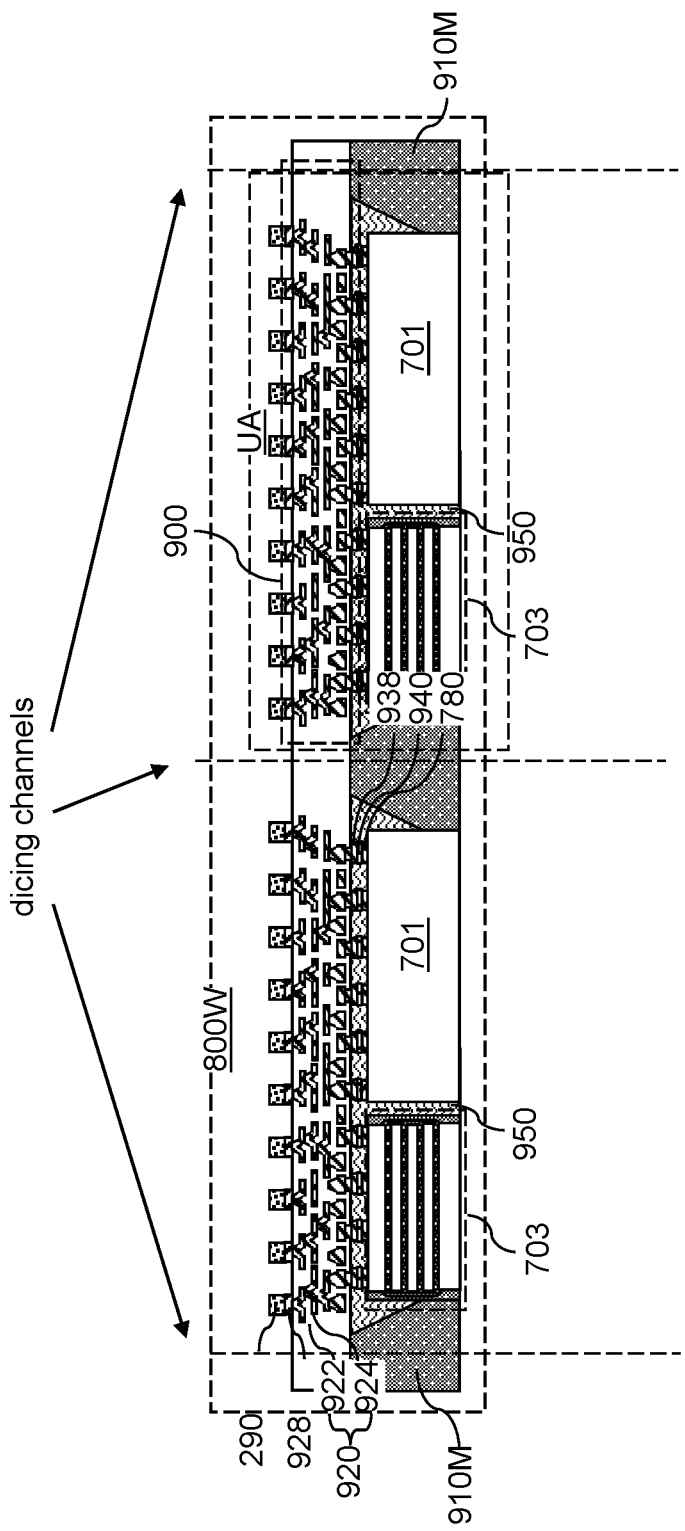
FIG. 9 is a vertical cross-sectional view of a region of the structure during dicing of a redistribution substrate and the EMC matrix according to an embodiment of the present disclosure.

Referring to FIG. 9, the reconstituted wafer 800W including the fan-out bonding pads 928 may be subsequently diced along dicing channels by performing a dicing process. The dicing channels correspond to the boundaries between neighboring pairs of die areas DA. Each diced unit from the reconstituted wafer 800W may include a fan-out package 800. In other words, each diced portion of the assembly of the two-dimensional array of sets of semiconductor dies (701, 703), the two-dimensional array of first underfill material portions 950, the EMC matrix 910M, and the two-dimensional array of interposers 900 constitutes a fan-out package 800. Each diced portion of the EMC matrix 910M constitutes a molding compound die frame 910. Each diced portion of the interposer layer (which includes the two-dimensional array of interposers 900) constitutes an interposer 900.

Figure 10A:
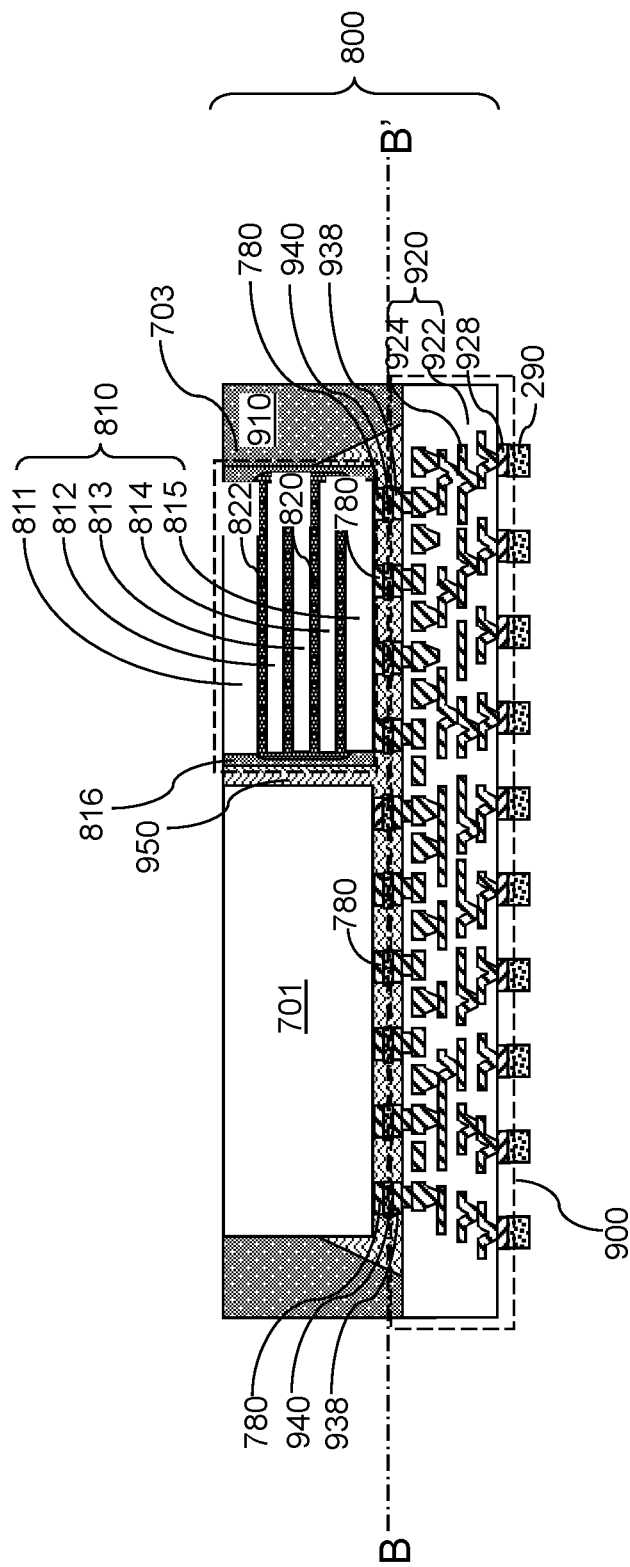
FIG. 10A is a vertical cross-sectional view of a fan-out package according to an embodiment of the present disclosure.
Figure 10B:
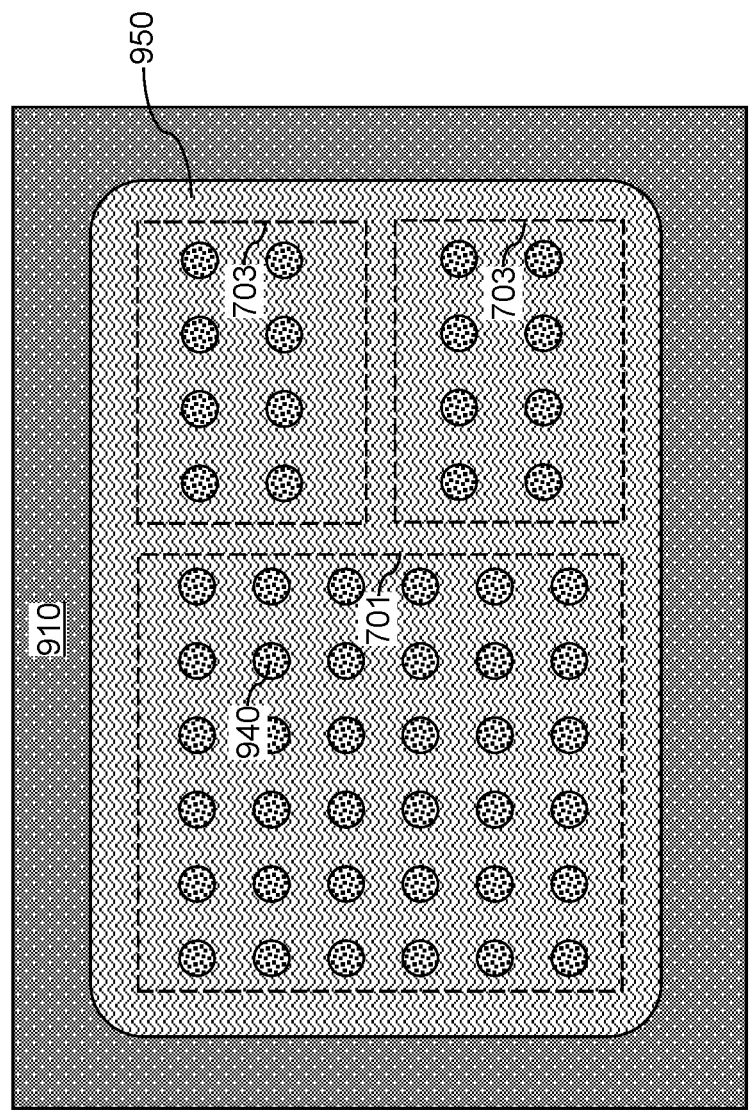
FIG. 10B is a horizontal cross-sectional view of the fan-out package along the horizontal plane B-B' of FIG. 10A.

Referring to FIGS. 10A and 10B, a fan-out package 800 obtained by dicing the structure at the processing steps of FIG. 9 is illustrated. The fan-out package 800 comprises an interposer 900 including on-interposer bump structure 938, at least one semiconductor die (701, 703) comprising a respective set of on-die bump structures 780 that is attached to the on-interposer bump structure 938 through a respective set of first solder material portions 940, a first underfill material portion 950 laterally surrounding the on-interposer bump structure 938 and the on-die bump structures 780 of the at least one semiconductor die (701, 703).

The fan-out package 800 may comprise a molding compound die frame 910 laterally surrounding the at least one semiconductor die (701, 703) and comprising a molding compound material. In one embodiment, the molding compound die frame 910 may include sidewalls that are vertically coincident with sidewalls of the interposer 900, i.e., located within same vertical planes as the sidewalls of the interposer 900. Generally, the molding compound die frame 910 may be formed around the at least one semiconductor die (701, 703) after formation of the first underfill material portion 950 within each fan-out package 800. The molding compound material contacts a peripheral portion of a planar surface of the interposer 900.

Figure 11A:
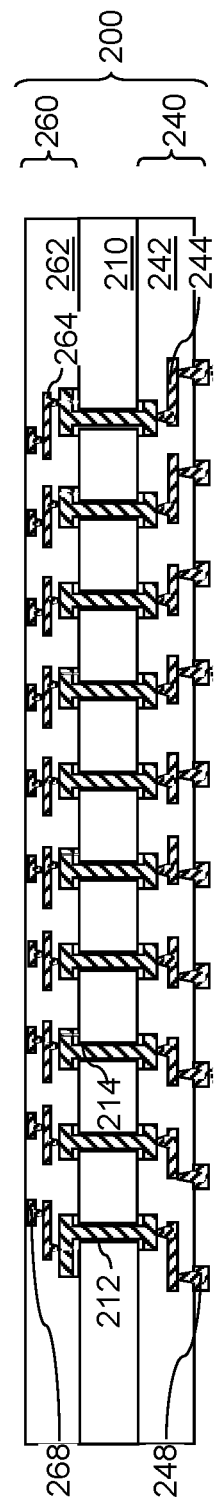
FIG. 11A is a vertical cross-sectional view of a packaging substrate according to an embodiment of the present disclosure.
Figure 11B:
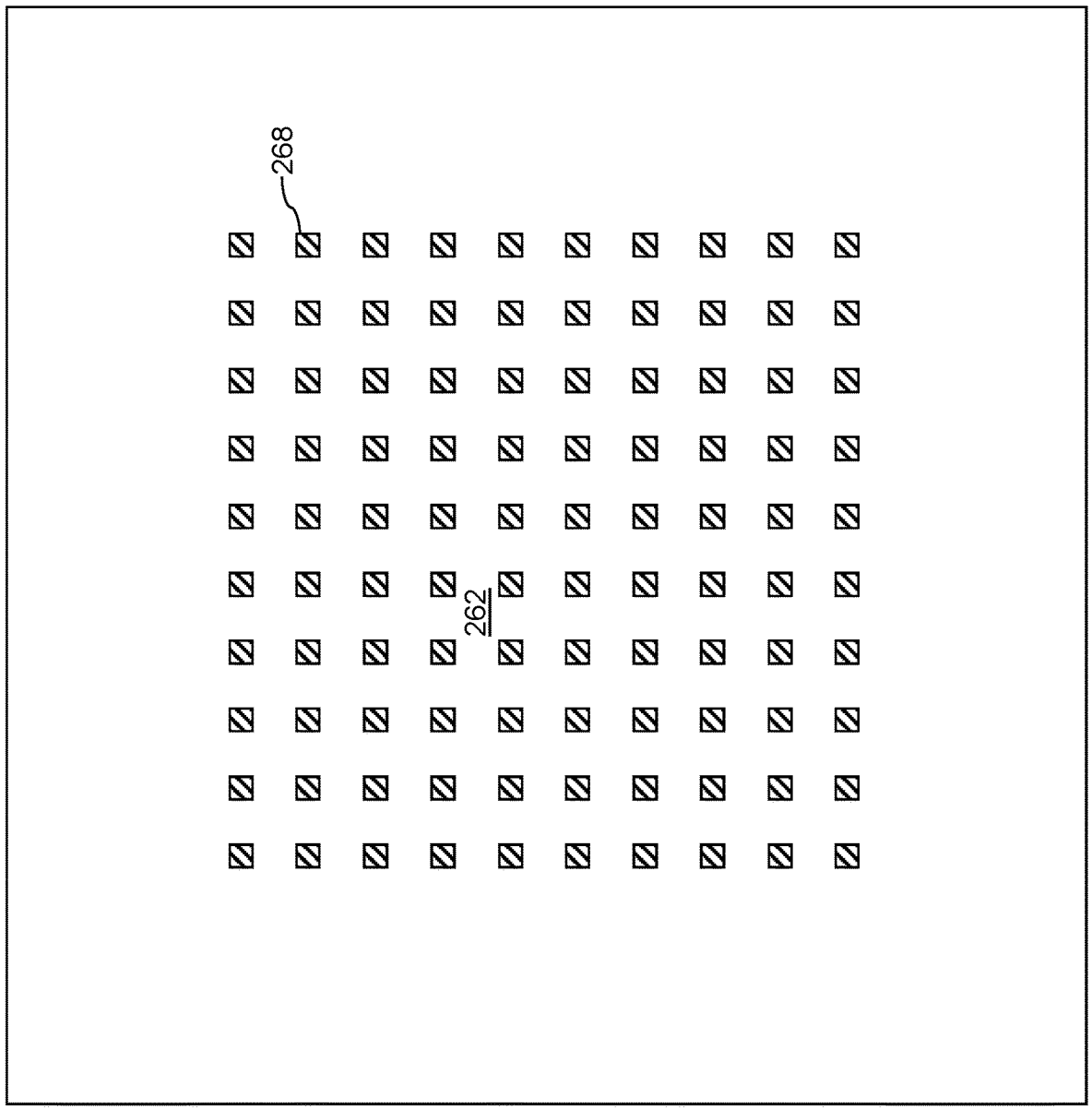
FIG. 11B is a top-down view of the packaging substrate of FIG. 11A.

Referring to FIGS. 11A and 11B, a packaging substrate 200 is provided. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers and/or dielectric interlayers, at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using an substrate package, it is understood that the scope of the present disclosure is not limited by any particular type of substrate package and may include an SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the packaging substrate 200 includes a chip-side surface laminar circuit 260 comprising chip-side wiring interconnects 264 connected to an array of chip-side bonding pads 268 that may be bonded to the array of second solder material portions 290, and a board-side surface laminar circuit 240 including board-side wiring interconnects 244 connected to an array of board-side bonding pads 248. The array of board-side bonding pads 248 is configured to allow bonding through solder balls. The array of chip-side bonding pads 268 may be configured to allow bonding through C4 solder balls. Generally, any type of packaging substrate 200 may be used. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

Figure 12:
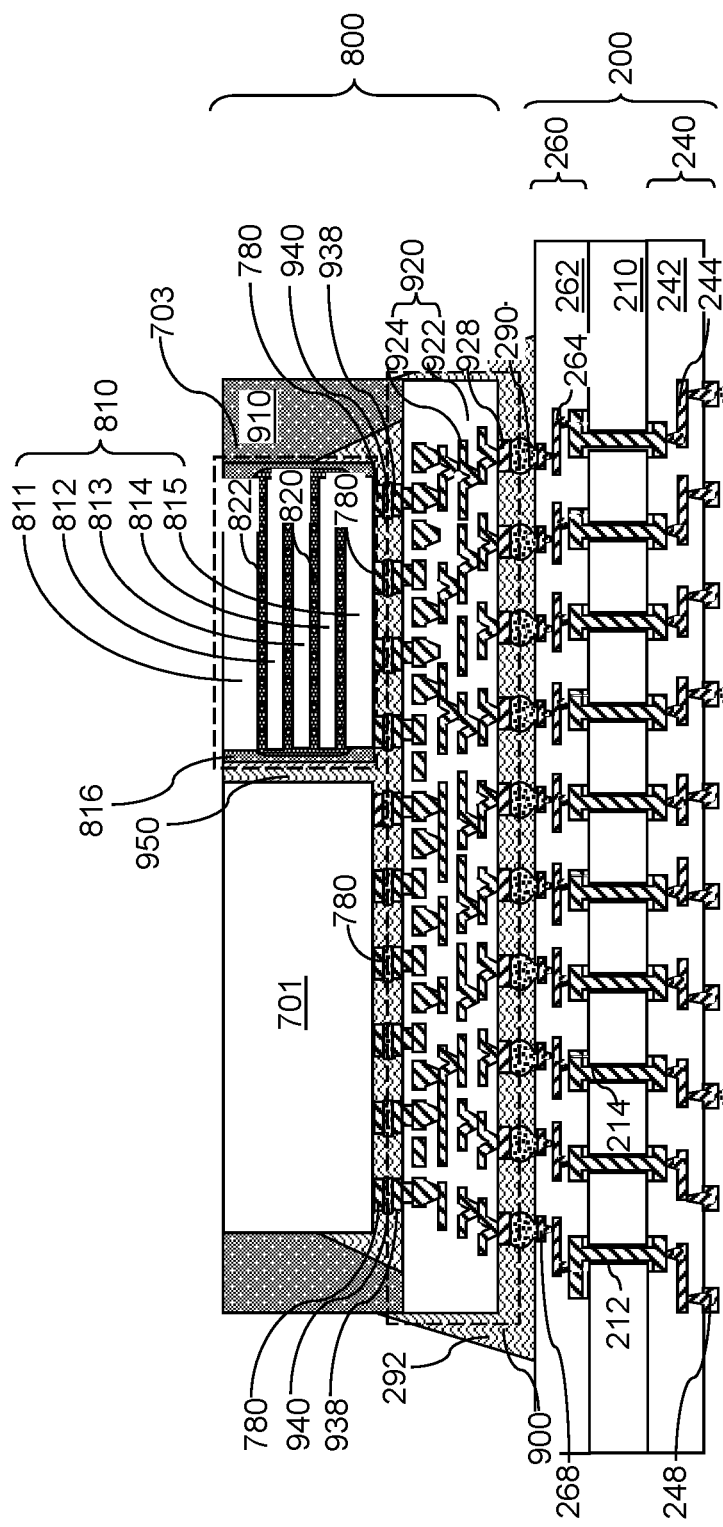
FIG. 12 is a vertical cross-sectional view of a structure after attaching the fan-out package to the packaging substrate and after forming a second underfill material portion according to an embodiment of the present disclosure.

Referring to FIG. 12, the fan-out package 800 may be disposed over the packaging substrate 200 with an array of the second solder material portions 290 therebetween. In embodiments in which the second solder material portions 290 are formed on the fan-out bonding pads 928 of the fan-out package 800, the second solder material portions 290 may be disposed on the chip-side bonding pads 268 of the packaging substrate 200. A reflow process may be performed to reflow the second solder material portions 290, thereby inducing bonding between the fan-out package 800 and the packaging substrate 200. Each second solder material portion 290 may be bonded to a respective one of the fan-out bonding pads 928 and to a respective one of the chip-side bonding pads 268. In one embodiment, the second solder material portions 290 may include C4 solder balls, and the fan-out package 800 may be attached to the packaging substrate 200 through an array of C4 solder balls. Generally, the fan-out package 800 may be bonded to the packaging substrate 200 such that the interposer 900 is bonded to the packaging substrate 200 by an array of solder material portions (such as the second solder material portions 290).

A second underfill material portion 292 may be formed around the second solder material portions 290 by applying and shaping a second underfill material. The second underfill material portion 292 may be formed by injecting the second underfill material around the array of second solder material portions 290 after the second solder material portions 290 are reflowed. Any known underfill material application method may be used, which may be, for example, the capillary underfill method, the molded underfill method, or the printed underfill method.

The second underfill material portion 292 may be formed between the interposer 900 and the packaging substrate 200. The second underfill material portion 292 may contact each of the second solder material portions 290 (which may be C4 solder balls or C2 solder caps), and may contact vertical sidewalls of the fan-out package 800. The second underfill material portion laterally surrounds, and contacts, the array of second solder material portions 290 and the fan-out package 800.

In one embodiment, the fan-out package 800 comprises a molding compound die frame 910 that laterally surrounds the at least one semiconductor die (701, 703) and contacting a peripheral portion of a top surface of the interposer 900. The second underfill material portion 292 may be formed directly on sidewalls of the molding compound die frame 910.

Generally, an assembly (such as a fan-out package 800) comprising an interposer 900 and semiconductor dies (701, 703) is provided. The assembly may be attached to a packaging substrate 200 using an array of solder material portions (such as second solder material portions 290);

Referring to FIGS. 13A and 13B and according to an aspect of the present disclosure, a lid structure 294 configured to be attached to the assembly of the interposer 900 and the semiconductor dies (701, 703) is illustrated. FIG. 13A is a bottom-up view of a first lid structure 294 according to an embodiment of the present disclosure. FIG. 13B is a vertical cross-sectional view of the first lid structure 294 along the vertical plane B-B' of FIG. 13A.

The lid structure 294 has the same area as, or approximately the same area as, the assembly of the interposer 900 and the semiconductor dies (701, 703) (such as the fan-out package 800) illustrated in FIG. 13 in a top-down view. According to an embodiment of the present disclosure, the lid structure 294 comprises a first plate portion 2941 having a first thickness t1, a second plate portion 2942 having a second thickness t2 that is less than the first thickness t1, and laterally surrounding, and adjoined to, the first plate portion 2941, and a plurality of foot portions 294F adjoined to the second plate portion 2942, and laterally spaced from the first plate portion 2941.

In one embodiment, the first plate portion 2941 may be located in an interposer-projection region having an areal overlap with the interposer 900 in a plan view. The interposer-projection region refers to a region defined by a vertical projection of an interposer 900 onto a horizontal plane, and coincides with the area of the interposer 900 in a top-down view. In one embodiment, the second plate portion 2942 may be located outside the interposer-projection region. In one embodiment, the boundary between the first plate portion 2941 and the second plate portion 2942 may coincide with, or may substantially coincide with, the area of the interposer 900.

In one embodiment, each of the foot portions 294F laterally extends along a respective lateral direction that is parallel to one of sidewalls of the lid structure 294. In one embodiment, the outer sidewalls of the lid structure 294 may be located along a periphery of the area of the lid structure 294 in a plan view, and may include first outer sidewalls that laterally extend along a first horizontal direction hd1 and second outer sidewalls that laterally extend along a second horizontal direction hd2 that is perpendicular to the first horizontal direction hd1. In this embodiment, each of the foot portions 294F may laterally extends along the first horizontal direction hd1 or along the second horizontal direction hd2. In one embodiment, each of the foot portions 294F may have a respective foot length FL along the respective lateral direction (hd1 or hd2).

In one embodiment, the respective foot length FL is less than a maximum lateral dimension of the first plate portion 2941 along the respective lateral direction (hd1 or hd2). In one embodiment, the first plate portion 2941 may have a shape or a rectangle or a rounded rectangle (i.e., a shape derived from a rectangle by rounding the four corners), and may have a first plate width PW along the first horizontal direction hd1 and may have a first plate length P1L along the second horizontal direction hd2. In this embodiment, each of the foot lengths FL may be less than the first plate width P1W and may be less than the first plate length P1L.

In one embodiment, each of the plurality of foot portions 294F has a respective lengthwise sidewall that may be parallel to a respective sidewall of the first plate portion 2941, may have a lesser lateral thickness than the respective sidewall of the first plate portion 2941, and may be laterally spaced from the respective sidewall of the first plate portion 2941 by a respective uniform spacing that equals a width (which is herein referred to as a channel width CW) of a respective channel segment CS of the second plate portion 2942.

While the present disclosure is described using an embodiment in which all foot lengths FL are the same, embodiments are expressly contemplated herein that the foot lengths FL along the first horizontal direction hd1 are different from foot lengths along the second horizontal direction hd2.

In one embodiment, the second plate portion 2942 may include four channel segments CS that are located between the first plate portion 2941 and a respective one of the foot portions 294F. In one embodiment, each of the four channel segments CS has a uniform channel width CW along a direction of a lateral spacing between the first plate portion 2941 and a most proximal one of the foot portions 294F. In one embodiment, the second plate portion 2942 comprises four corner plate segments CPS that are adjoined to the four channel segments CS. In one embodiment, each of the foot portions 294F has a respective foot length FL along a horizontal direction (hd1 or hd2) that is perpendicular to a direction of separation from the first plate portion 2941, and has a respective foot width FW along another horizontal direction (hd1 or hd2) that is parallel to the direction of separation from the first plate portion 2941. Generally, the foot widths FL are less than the foot length FL.

In one embodiment, each of the four corner plate segments CPS may have a respective first lateral dimension DGX along a first horizontal direction hd1 and a respective second lateral dimension DGY along a second horizontal direction hd2. In one embodiment, each of the first lateral dimensions DGX and the second lateral dimensions DGY is greater than any of the foot widths FW of the foot portions 294F.

In one embodiment, the four corner plate segments CPS of the second plate portion 2942 are adjoined to a respective pair of two outmost sidewalls of the lid structure 294. In one embodiment, each of the foot portions 294F comprises a respective lengthwise sidewall (such as an inner lengthwise sidewall facing the first plate portion 2941) that has a top edge that is adjoined to the second plate portion 2942 within a horizontal plane that overlies a horizontal plane including a bottom surface of the first plate portion 2941.

As seen from the bottom side, the lid structure 294 comprises four trenches located in the areas of the channel segments CS of the second plate portion 2942. In one embodiment, top surfaces of the first plate portion 2941, the second plate portion 2942, and the plurality of foot portions 294F are located within a same horizontal plane. In other words, the entirety of the top surface of the lid structure 294 may be located within a same horizontal plane.

The various parameters of the geometric features of the lid structure 294 may be optimized as needed. Table 1 lists values for a subset of the parameters in FIGS. 13A and 13B, which do not limit the values of the parameters but serves as an illustrative example.

TABLE 1

Typical values of some parameters of the lid structure 294 of the present disclosure.

| parameter | nature of the parameter | value |
| --- | --- | --- |
| t1 | thickness of the first plate portion 2941 | ~2 mm (typical) Or range from 1 mm~3 mm |
| t1 − t2 | thickness differential between the first plate portion 2941 and the second plate portion 2942 | 0.3 mm~1.5 mm |
| DGX | lateral dimension of each corner plate segment within the second plate portion 2942 along the first horizontal direction hd1 | greater than the sum of FW (foot width) and CW (channel width) |
| DGY | lateral dimension of each corner plate segment within the second plate portion 2942 along the second horizontal direction hd2 | greater than the sum of FW (foot width) and CW (channel width) |
| h | height of each inner lengthwise sidewall of the foot portions 294F | (t1 − t2) + δ; δ is about 0.5 mm to 2.0 mm. |

Referring to FIGS. 14A and 14B and according to an aspect of the present disclosure, an alternative lid structure 294 configured to be attached to the assembly of the interposer 900 and the semiconductor dies (701, 703) is illustrated. FIG. 13A is a bottom-up view of a first lid structure 294 according to an embodiment of the present disclosure. FIG. 13B is a vertical cross-sectional view of the first lid structure 294 along the vertical plane B-B' of FIG. 13A.

The lid structure 294 has the same area as, or approximately the same area as, the assembly of the interposer 900 and the semiconductor dies (701, 703) (such as the fan-out package 800) illustrated in FIG. 13 in a top-down view. According to an embodiment of the present disclosure, the lid structure 294 comprises a first plate portion 2941 having a first thickness t1, a second plate portion 2942 having a second thickness t2 that is less than the first thickness t1, and laterally surrounding, and adjoined to, the first plate portion 2941, and a plurality of foot portions 294F adjoined to the second plate portion 2942, and laterally spaced from the first plate portion 2941. Further the lid structure 294 may comprise four rim portions 294R. Each of the rim portions 294R is connected to a respective pair of foot portions 294F, and defines a portion of an outer boundary of the lid structure 294.

In one embodiment, the first plate portion 2941 may be located in an interposer-projection region having an areal overlap with the interposer 900 in a plan view. The interposer-projection region refers to a region defined by a vertical projection of an interposer 900 onto a horizontal plane, and coincides with the area of the interposer 900 in a top-down view. In one embodiment, the second plate portion 2942 may be located outside the interposer-projection region. In one embodiment, the boundary between the first plate portion 2941 and the second plate portion 2942 may coincide with, or may substantially coincide with, the area of the interposer 900.

In one embodiment, each of the foot portions 294F laterally extends along a respective lateral direction that is parallel to one of sidewalls of the lid structure 294. In one embodiment, the outer sidewalls of the lid structure 294 may be located along a periphery of the area of the lid structure 294 in a plan view, and may include first outer sidewalls that laterally extend along a first horizontal direction hd1 and second outer sidewalls that laterally extend along a second horizontal direction hd2 that is perpendicular to the first horizontal direction hd1. In this embodiment, each of the foot portions 294F may laterally extends along the first horizontal direction hd1 or along the second horizontal direction hd2. In one embodiment, each of the foot portions 294F may have a respective foot length FL along the respective lateral direction (hd1 or hd2).

Each of the rim portions 294R may include a first segment that laterally extends along the first horizontal direction hd1 and a second segment that laterally extends along the second horizontal direction hd2. Generally, each rim portion 294R may have an "L-shaped" horizontal cross-sectional shape. The lateral width of each rim portion 294R is herein referred to as a rim width RW, which is less than the foot width FW. The rim width RW may be, for example, about 3 mm. The height of each inner sidewall of the rim portions 294R may be the same as the height h of each inner sidewall of the foot portions 294F.

In one embodiment, the respective foot length FL is less than a maximum lateral dimension of the first plate portion 2941 along the respective lateral direction (hd1 or hd2). In one embodiment, the first plate portion 2941 may have a shape or a rectangle or a rounded rectangle (i.e., a shape derived from a rectangle by rounding the four corners), and may have a first plate width P1W along the first horizontal direction hd1 and may have a first plate length P1L along the second horizontal direction hd2. In this embodiment, each of the foot lengths FL may be less than the first plate width P1W and may be less than the first plate length P1L.

In one embodiment, each of the plurality of foot portions 294F has a respective lengthwise sidewall that is parallel to a respective sidewall of the first plate portion 2941, has a lesser lateral thickness than the respective sidewall of the first plate portion 2941, and is laterally spaced from the respective sidewall of the first plate portion 2941 by a respective uniform spacing that equals a width (which is herein referred to as a channel width CW) of a respective channel segment CS of the second plate portion 2942.

While the present disclosure is described using an embodiment in which all foot lengths FL are the same, embodiments are expressly contemplated herein that the foot lengths FL along the first horizontal direction hd1 are different from foot lengths along the second horizontal direction hd2.

In one embodiment, the second plate portion 2942 comprises four channel segments CS that are located between the first plate portion 2941 and a respective one of the foot portions 294F. In one embodiment, each of the four channel segments CS has a uniform channel width CW along a direction of a lateral spacing between the first plate portion 2941 and a most proximal one of the foot portions 294F. In one embodiment, the second plate portion 2942 comprises four corner plate segments CPS that are adjoined to the four channel segments CS. In one embodiment, each of the foot portions 294F has a respective foot length FL along a horizontal direction (hd1 or hd2) that is perpendicular to a direction of separation from the first plate portion 2941, and has a respective foot width FW along another horizontal direction (hd1 or hd2) that is parallel to the direction of separation from the first plate portion 2941. Generally, the foot widths FL are less than the foot length FL.

In one embodiment, each of the four corner plate segments CPS has a respective first lateral dimension DGX along a first horizontal direction hd1 and a respective second lateral dimension DGY along a second horizontal direction hd2. In one embodiment, each of the first lateral dimensions DGX and the second lateral dimensions DGY is greater than any of the foot widths FW of the foot portions 294F. Each of the four corner plate segments CPS may be laterally bounded by a rim portion 294R and a pair of foot portions 294F.

In one embodiment, the four corner plate segments CPS of the second plate portion 2942 are laterally spaced from outermost sidewalls of the lid structure 294 by a respective rim portion 294R of the lid structure 294 having a same vertical extent as the foot portions 294F. In one embodiment, each of the foot portions 294F comprises a respective lengthwise sidewall (such as an inner lengthwise sidewall facing the first plate portion 2941) that has a top edge that is adjoined to the second plate portion 2942 within a horizontal plane that overlies a horizontal plane including a bottom surface of the first plate portion 2941.

As seen from the bottom side, the lid structure 294 comprises a moat trench that laterally surrounds the first plate portion 2941 and laterally surrounded by the foot portions 294F. In one embodiment, top surfaces of the first plate portion 2941, the second plate portion 2942, the plurality of foot portions 294F, and the plurality of rim portions 294R are located within a same horizontal plane. In other words, the entirety of the top surface of the lid structure 294 may be located within a same horizontal plane. The various parameters of the geometric features of the lid structure 294 may be optimized as needed.

Figure 15A:
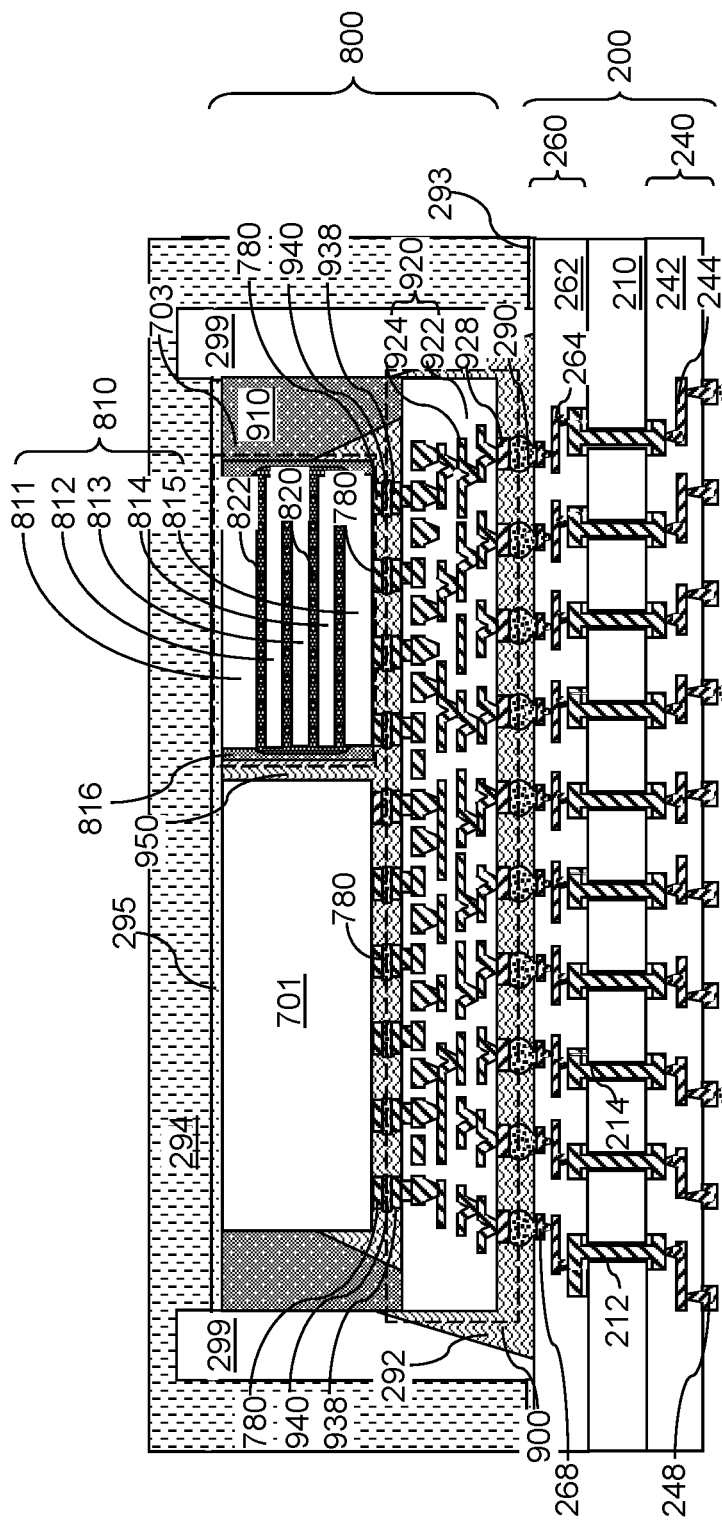
FIGS. 15A-15D are various views of a first embodiment of the structure that includes the first lid structure according to an embodiment of the present disclosure.
Figure 15B:
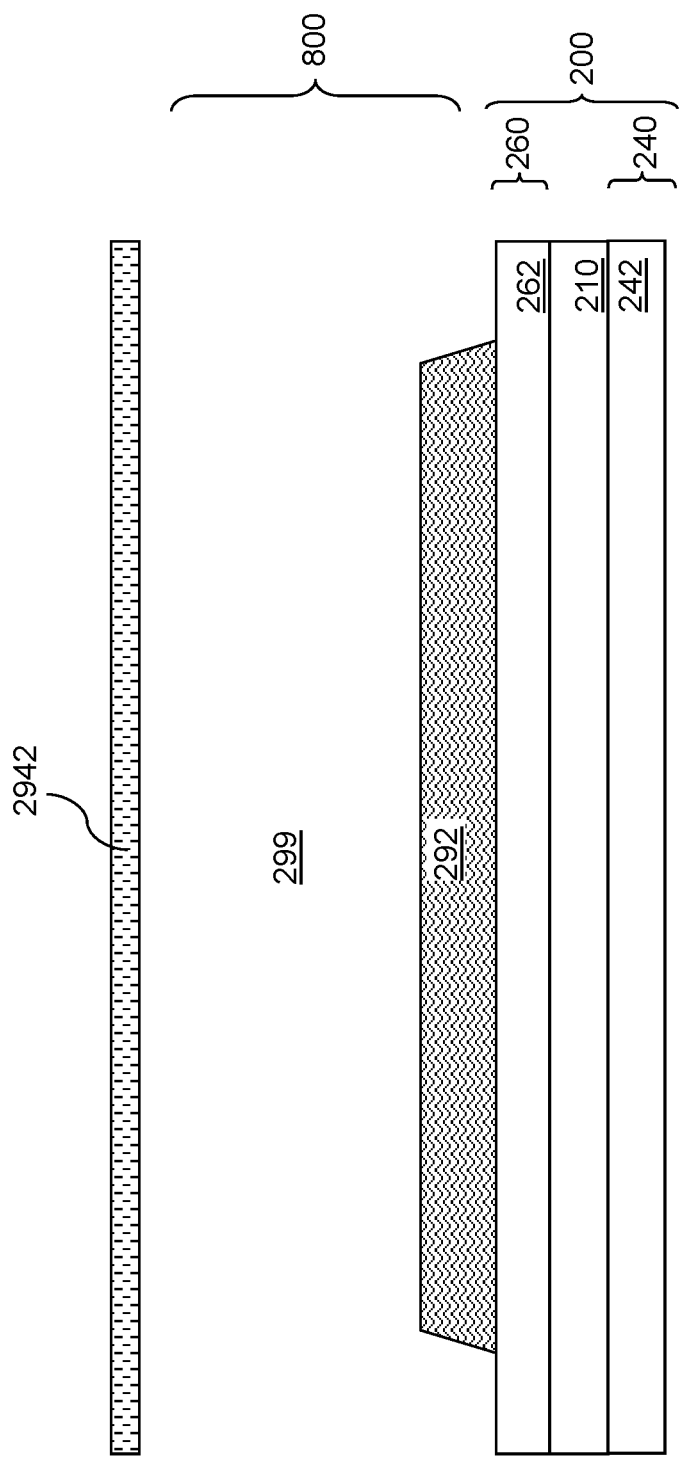
Figure 15C:
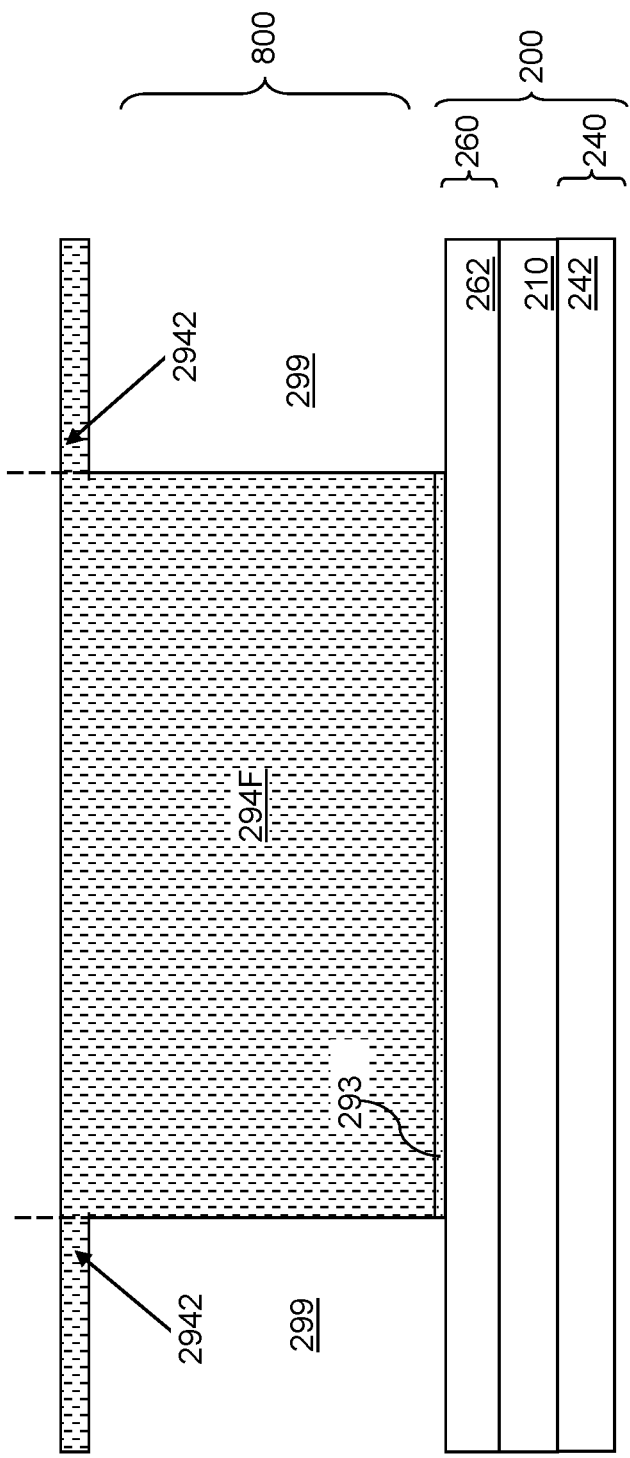
Figure 15D:
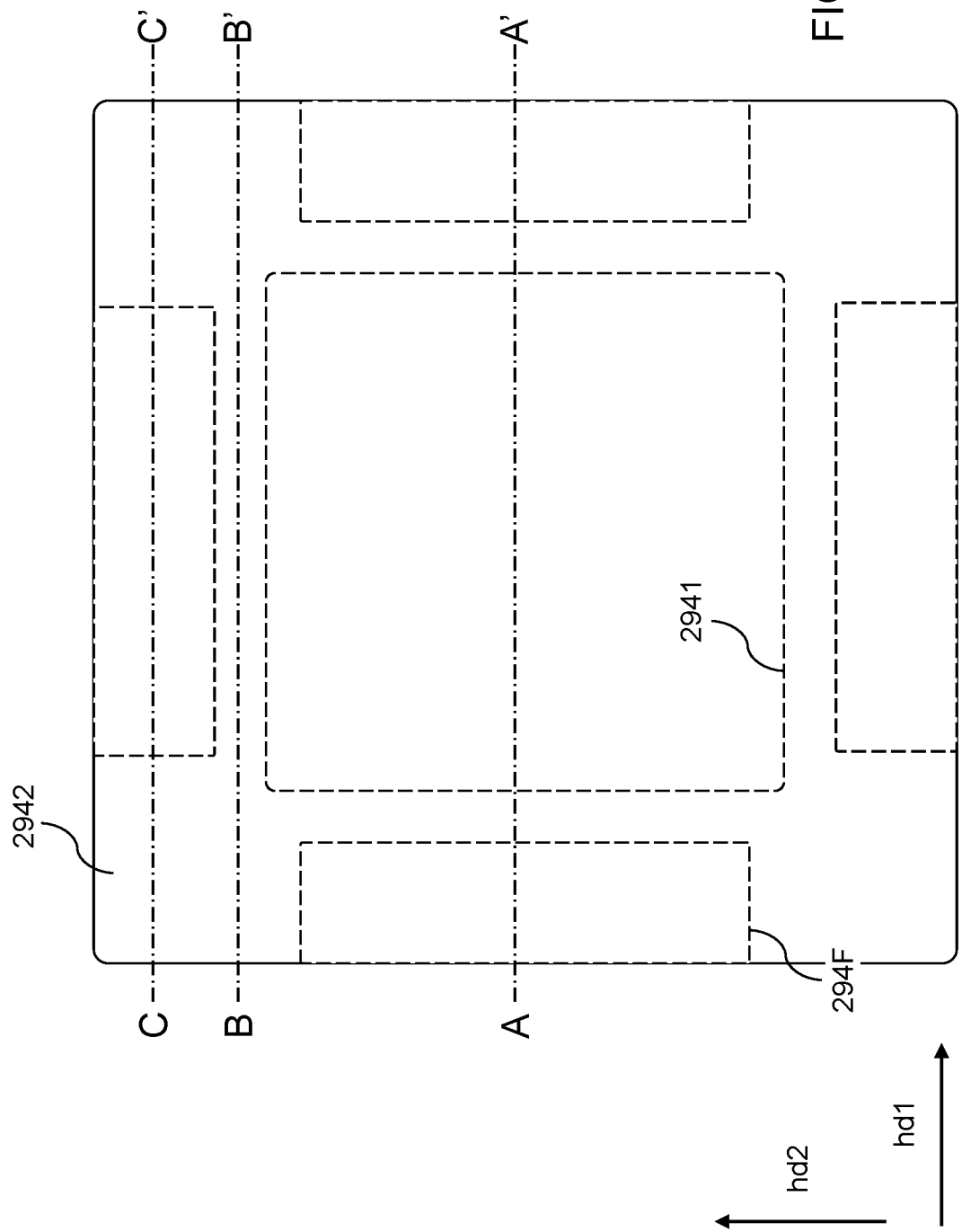

Referring to FIGS. 15A-15D and according to an embodiment of the present disclosure, the lid structure 294 of FIGS. 13A and 13B may be attached to the assembly of a packaging substrate 200 and semiconductor dies (703, 704) (such as a fan-out package 800) illustrated in FIG. 12. FIGS. 15A-15D are various views of a first embodiment of the structure that includes the first lid structure 294 according to an embodiment of the present disclosure. FIGS. 15A, 15B, and 15C are vertical cross-sectional views of the first embodiment of the structure. FIG. 15D is a top-down view of the first embodiment of the structure. The vertical plane A-A' in FIG. 15D is a cut plane of the vertical cross-sectional view of FIG. 15A, the vertical plane B-B' in FIG. 15D is a cut plane of the vertical cross-sectional view of FIG. 15B, and the vertical plane C-C' in FIG. 15D is a cut plane of the vertical cross-sectional view of FIG. 15C.

Generally, the plurality of foot portions 294F of the lid structure 294 may be attached to a planar surface of the packaging substrate 200 through adhesive portions 293 such that the lid structure 294 covers the assembly (such as a fan-out package 800). In this embodiment, the adhesive portions 293 may be applied to at least one of the peripheral portion of a front surface of the packaging substrate 200 and the bottom surfaces of the foot portions 294F of the lid structure 294, and the foot portions 294F of the lid structure 294 and the packaging substrate 200 may be pushed against each other while curing. In an illustrative example, the adhesive portions 293 may comprise a hybrid polymer adhesive material (i.e., a modified silicone (MS) polymer adhesive material), which is a one-part, elastic adhesive based on a modified silane polymer which cures upon exposure to moisture to form a high-performance elastomer.

In one embodiment, a thermal interface material (TIM) layer 295 may be formed between a top surface of the assembly (such as a fan-out package 800) and a bottom surface of the first plate portion 2941 such that the TIM layer 295 contacts the top surface of the assembly (such as a fan-out package 800) and the bottom surface of the first plate portion 2941. In one embodiment, TIM layer 295 may have thermal conductivity that is greater than about 2 W/m·K, and/or greater than 10 W/m·K, and/or greater than 50 W/m·K. The TIM layer 295 may include a polymer, resin, or epoxy as a base material, as well as a filler to improve its thermal conductivity. The filler may include a dielectric filler such as alumina, magnesia, aluminum nitride, boron nitride, and diamond powder. The filler may also be a metal filler such as silver, copper, aluminum, and the like. The filler may be in the form of spherical particles. Alternative thermal interface materials may also be used for the TIM layer 295. In one embodiment, the periphery of the TIM layer 295 may coincide with, or may substantially coincide with, the periphery of the top surface of the fan-out package 800 and/or the periphery of the first plate portion 2941. In one embodiment, the TIM layer 295 may comprise an epoxy-based thermal interface material.

In one embodiment, the first plate portion 2941 may be positioned in an interposer-projection region having an areal overlap with the interposer 900 in a plan view upon attaching the plurality of foot portions 294F of the lid structure 294 to the planar surface of the packaging substrate 200. In one embodiment, the second plate portion 2942 may be positioned outside the interposer-projection region upon attaching the plurality of foot portions 294F of the lid structure 294 to the planar surface of the packaging substrate 200.

In one embodiment, the first plate portion 2941 may be located in an interposer-projection region having an areal overlap with the interposer 900 in a plan view. The interposer-projection region refers to a region defined by a vertical projection of an interposer 900 onto a horizontal plane, and coincides with the area of the interposer 900 in a top-down view. In one embodiment, the second plate portion 2942 may be located outside the interposer-projection region. In one embodiment, the boundary between the first plate portion 2941 and the second plate portion 2942 may coincide with, or may substantially coincide with, the area of the interposer 900.

In one embodiment, an intra-lid cavity 299 laterally surrounding the first plate portion 2941 and the assembly (such as a fan-out package 800) is formed upon attaching the plurality of foot portions 294F of the lid structure to the planar surface of the packaging substrate 200. The intra-lid cavity 299 is laterally surrounded by the foot portions 294F. The intra-lid cavity 299 is connected to an ambient located outside outmost sidewalls of the lid structure 294 through a plurality of openings located between the foot portions 294F.

Figure 16A:
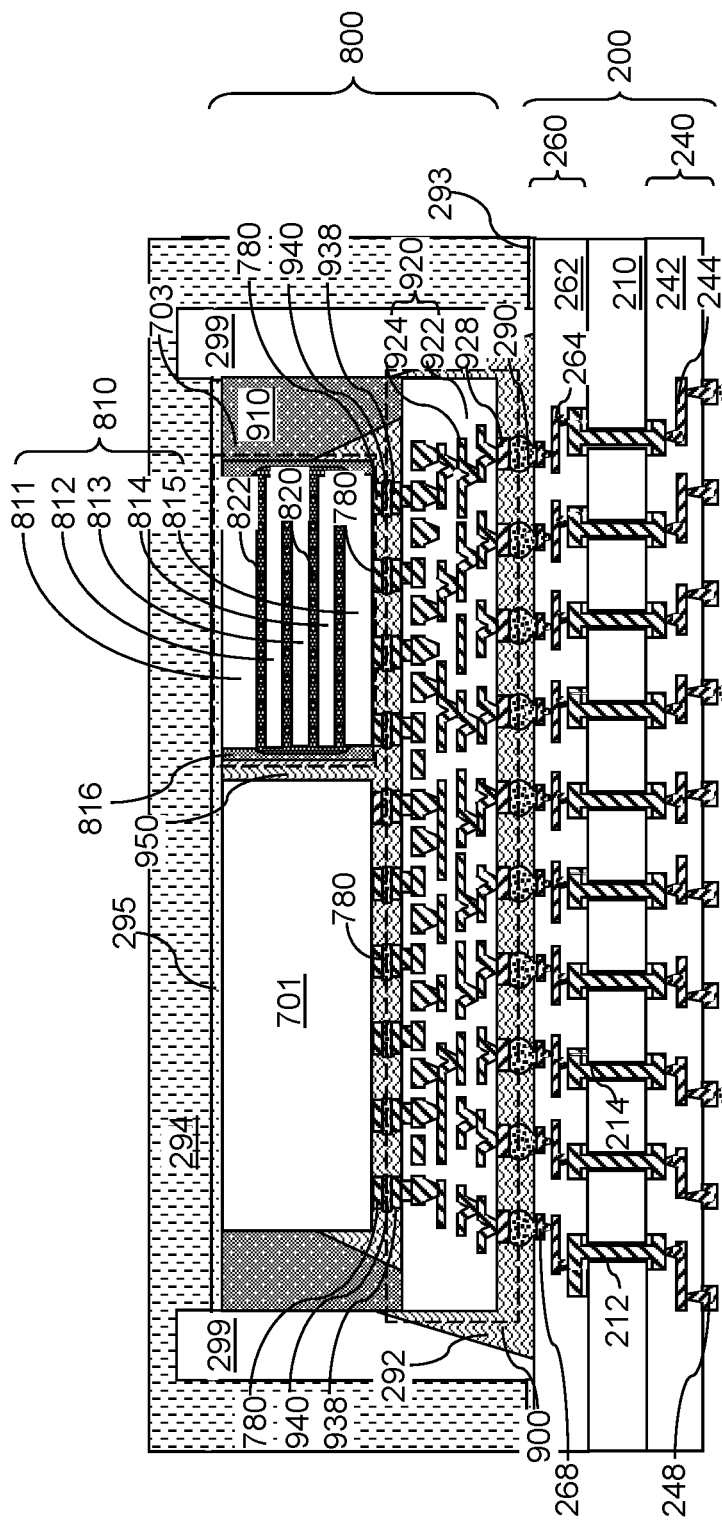
FIGS. 16A-16D are various views of a second embodiment of the structure that includes the second exemplary lid structure according to an embodiment of the present disclosure.
Figure 16B:
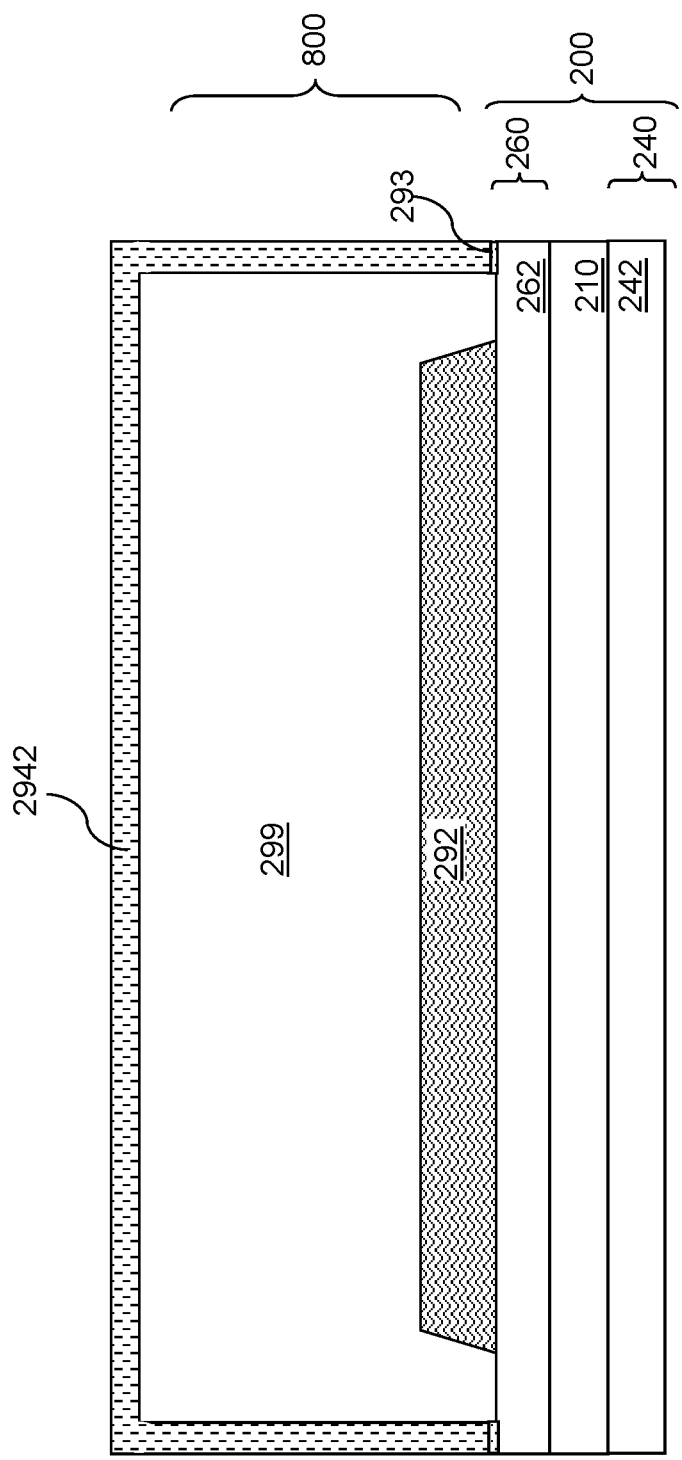
Figure 16C:
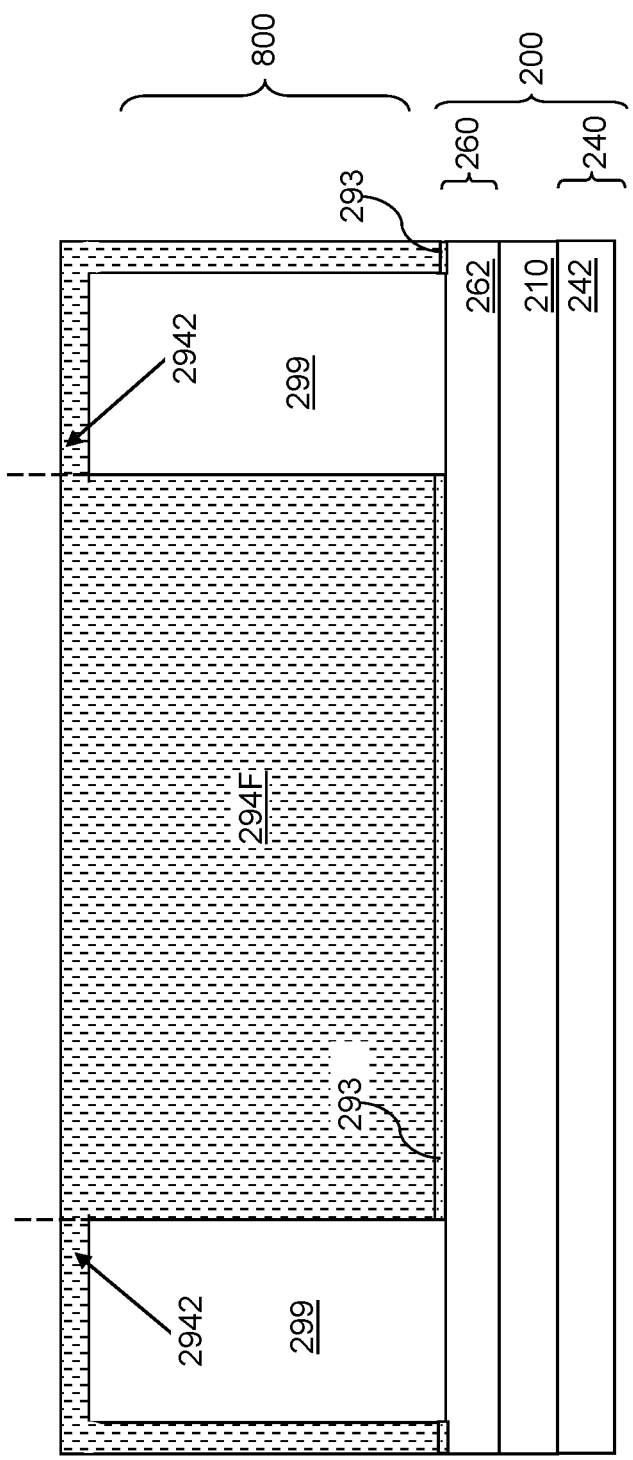
Figure 16D:
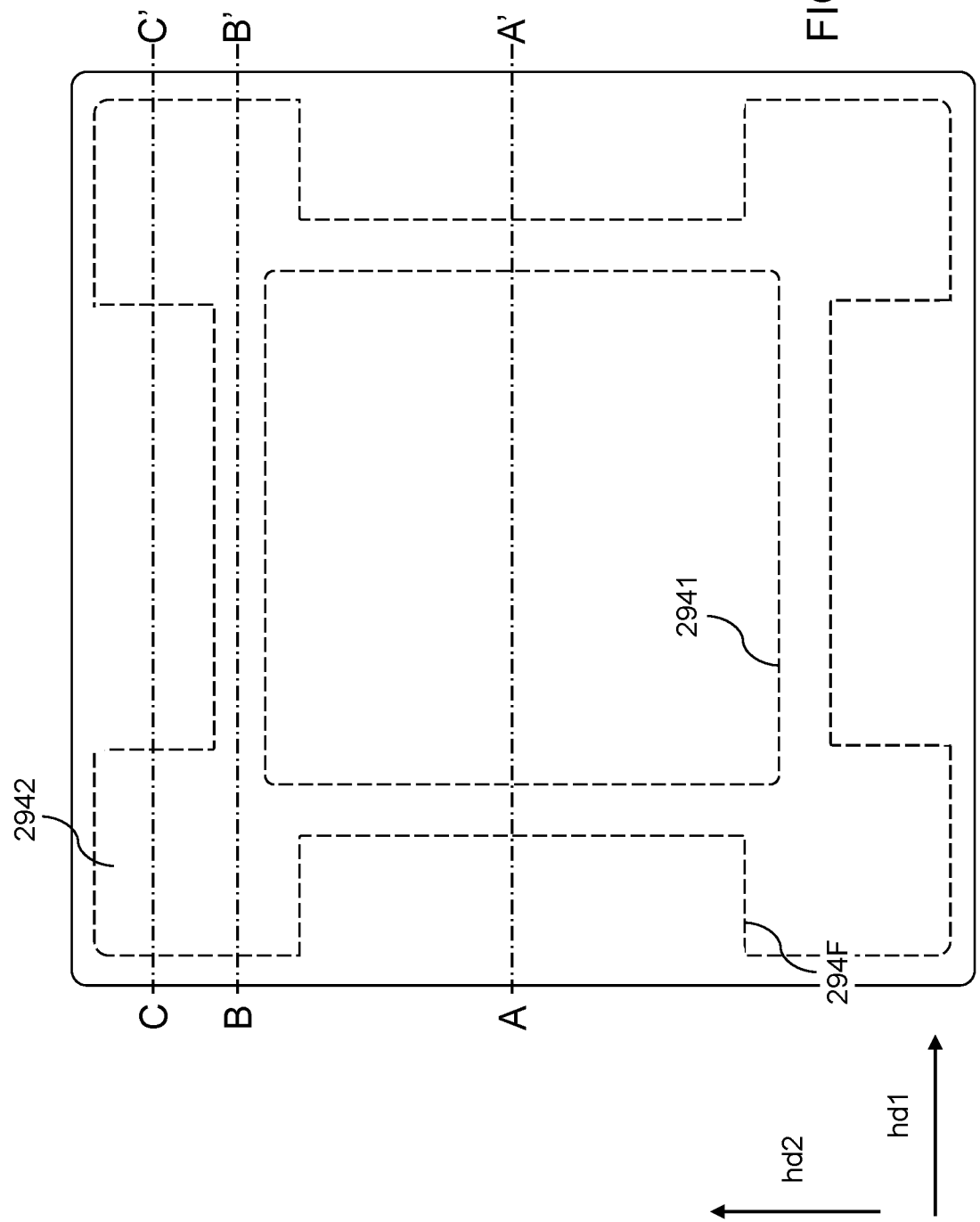

Referring to FIGS. 16A-16D and according to an alternative embodiment of the present disclosure, the lid structure 294 of FIGS. 14A and 14B may be attached to the assembly of a packaging substrate 200 and semiconductor dies (703, 704) (such as a fan-out package 800) illustrated in FIG. 12. FIGS. 16A-16D are various views of a second embodiment of the structure that includes the second lid structure 294 according to an embodiment of the present disclosure. FIGS. 16A, 16B, and 16C are vertical cross-sectional views of the second embodiment of the structure. FIG. 16D is a top-down view of the second embodiment of the structure. The vertical plane A-A' in FIG. 16D is a cut plane of the vertical cross-sectional view of FIG. 16A, the vertical plane B-B' in FIG. 16D is a cut plane of the vertical cross-sectional view of FIG. 16B, and the vertical plane C-C' in FIG. 16D is a cut plane of the vertical cross-sectional view of FIG. 16C.

In one embodiment, an intra-lid cavity 299 laterally surrounding the first plate portion 2941 and the assembly (such as a fan-out package 800) is formed upon attaching the plurality of foot portions 294F of the lid structure to the planar surface of the packaging substrate 200. The intra-lid cavity 299 is laterally surrounded by the foot portions 294F. The intra-lid cavity 299 is encapsulated within the lid structure 294, and is disconnected from an ambient located outside outmost sidewalls of the lid structure 294 by a combination of the foot portions 294F and rim portions 294R of the lid structure 294 that connect the foot portions 294F and having a lesser lateral thickness than the foot portions 294F.

Figure 17B:
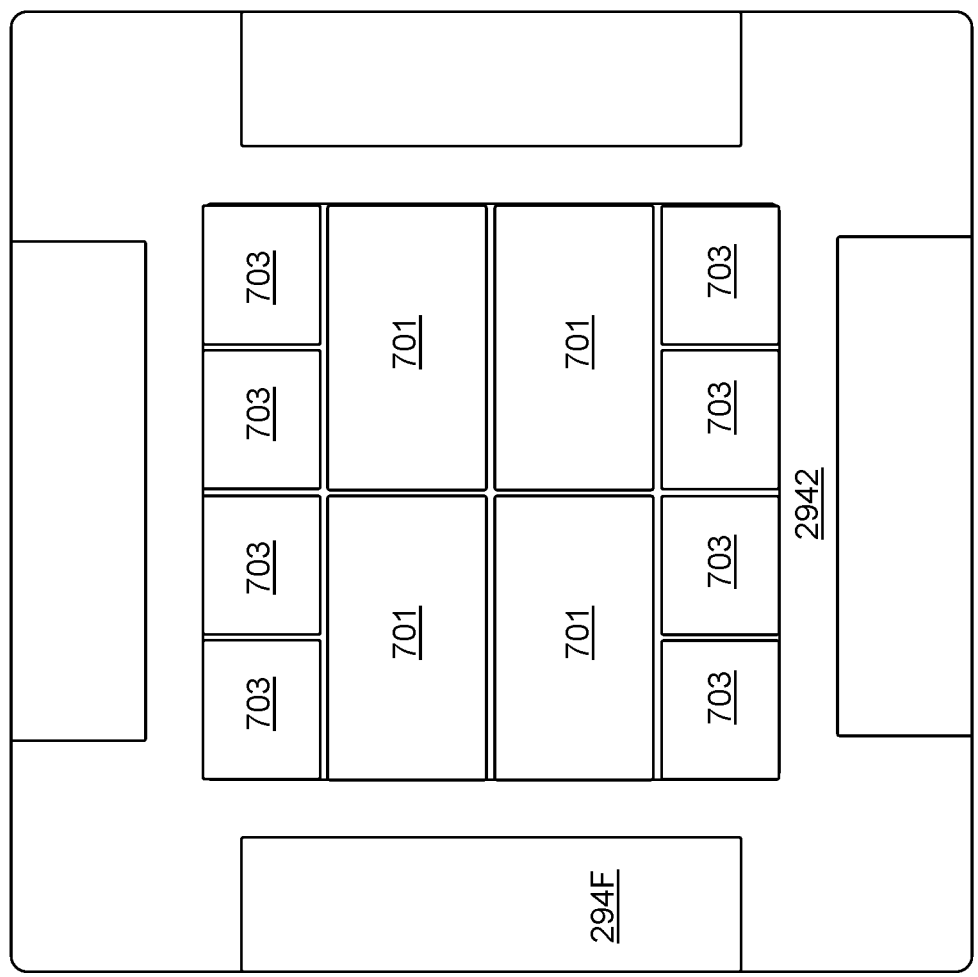

Referring to FIGS. 17A and 17B, alternative semiconductor die arrangements in the first embodiment of the structure in FIGS. 15A-15D are illustrated in plan views. The configuration of FIG. 17A corresponds to the configuration of the semiconductor dies (701, 703) illustrated in FIG. 3C. The configuration of FIG. 17B corresponds to the configuration of the semiconductor dies (701, 703) illustrated in FIG. 3D. Generally, any arrangement of semiconductor dies (701, 703) may be used in conjunction with the first embodiment of the structure in FIGS. 15A-15D.

Figure 18A:
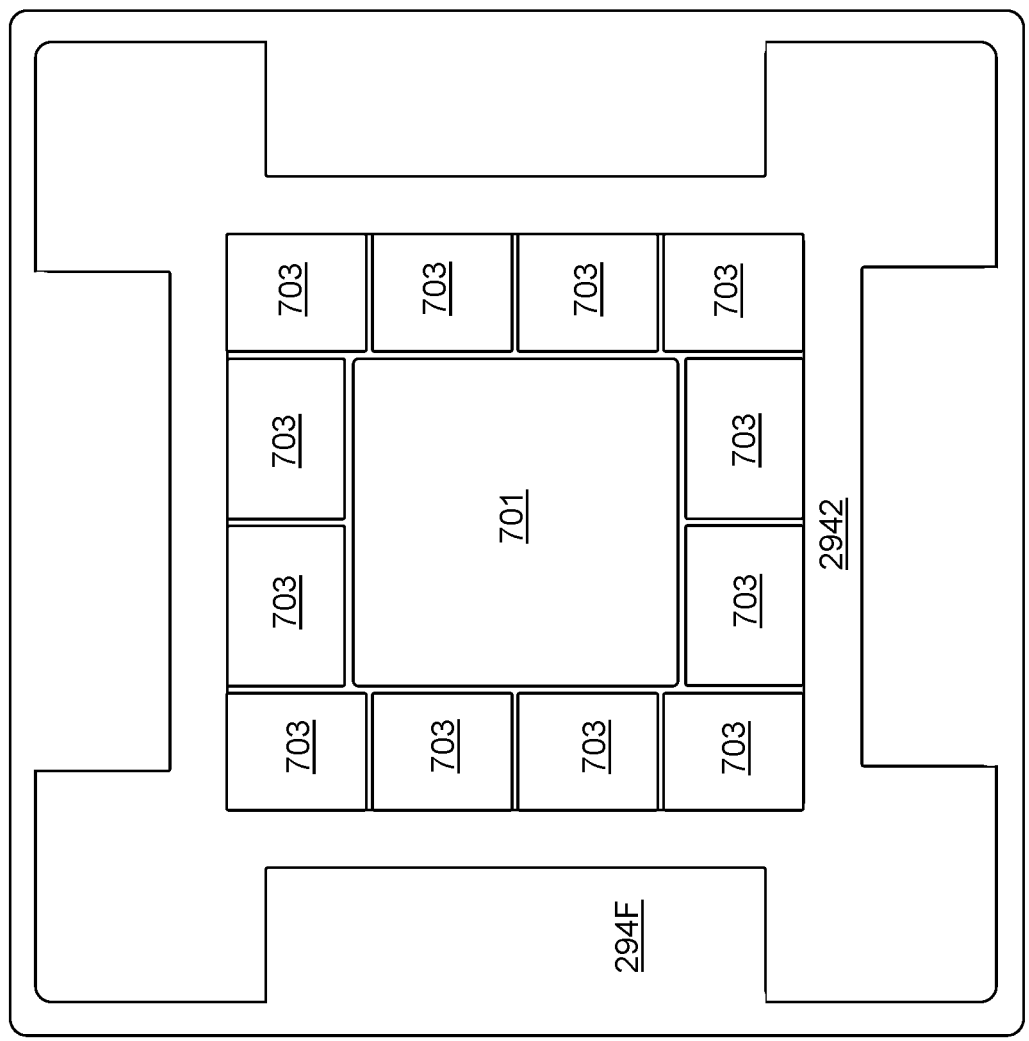
FIGS. 18A and 18B illustrate alternative semiconductor die arrangements in the second embodiment of the structure in FIGS. 16A-16D in plan views.
Figure 18B:
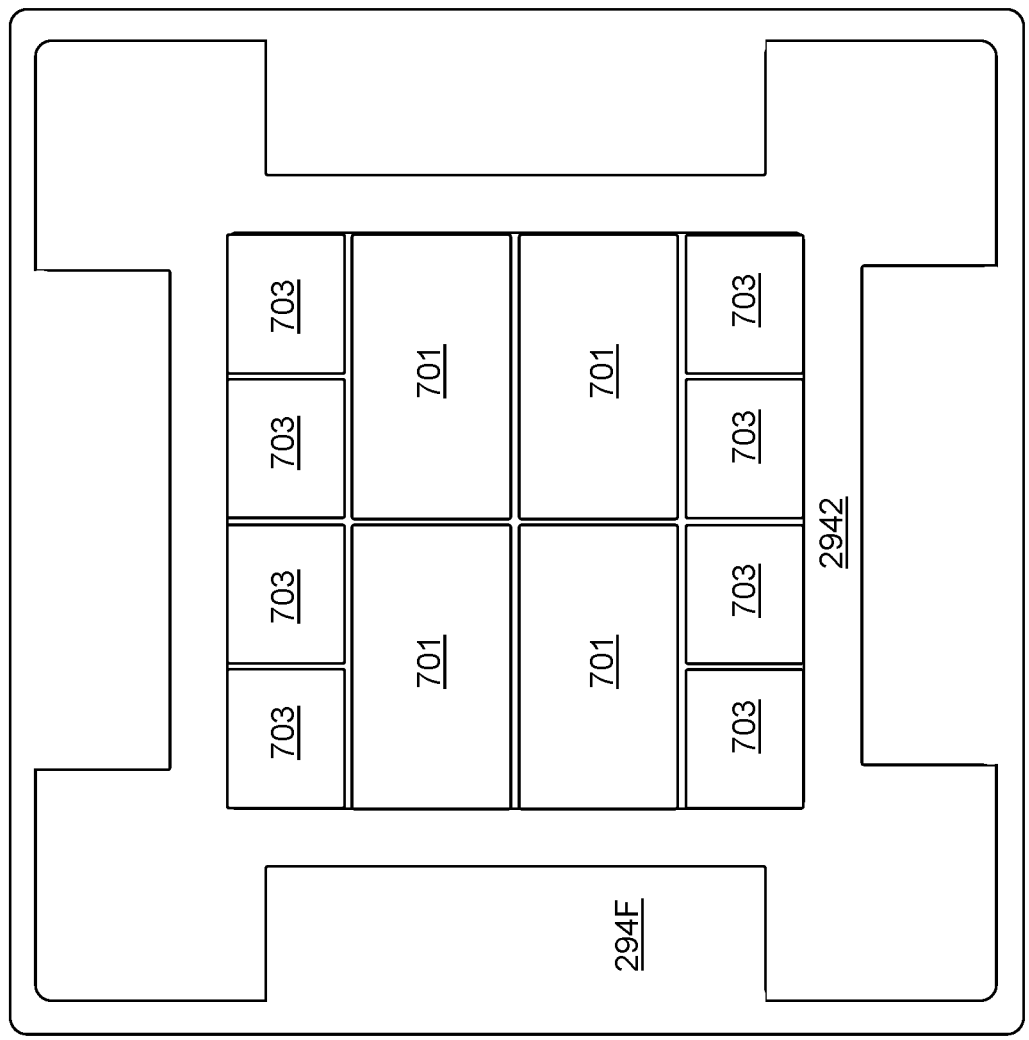

Referring to FIGS. 18A and 18B, alternative semiconductor die arrangements in the second embodiment of the structure in FIGS. 16A-16D are illustrated in plan views. The configuration of FIG. 18A corresponds to the configuration of the semiconductor dies (701, 703) illustrated in FIG. 3C. The configuration of FIG. 18B corresponds to the configuration of the semiconductor dies (701, 703) illustrated in FIG. 3D. Generally, any arrangement of semiconductor dies (701, 703) may be used in conjunction with the first embodiment of the structure in FIGS. 16A-16D.

Figure 19:
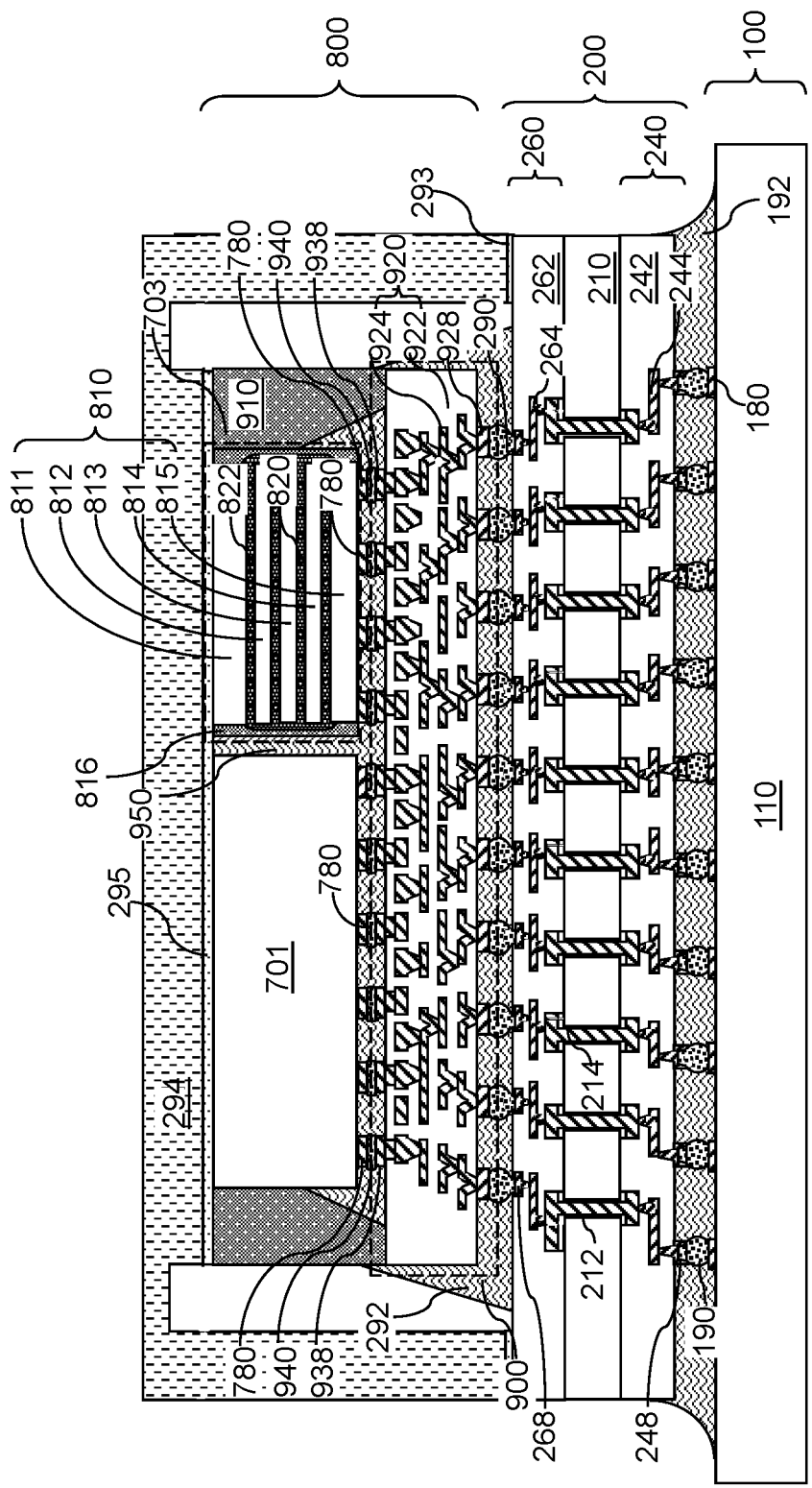
FIG. 19 is a vertical cross-sectional view of the structure after the packaging substrate is attached to a printed circuit board (PCB) according to an embodiment of the present disclosure.

Referring to FIG. 19, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The packaging substrate 200 is attached to the PCB 100 through the array of solder joints 190.

Figure 20:
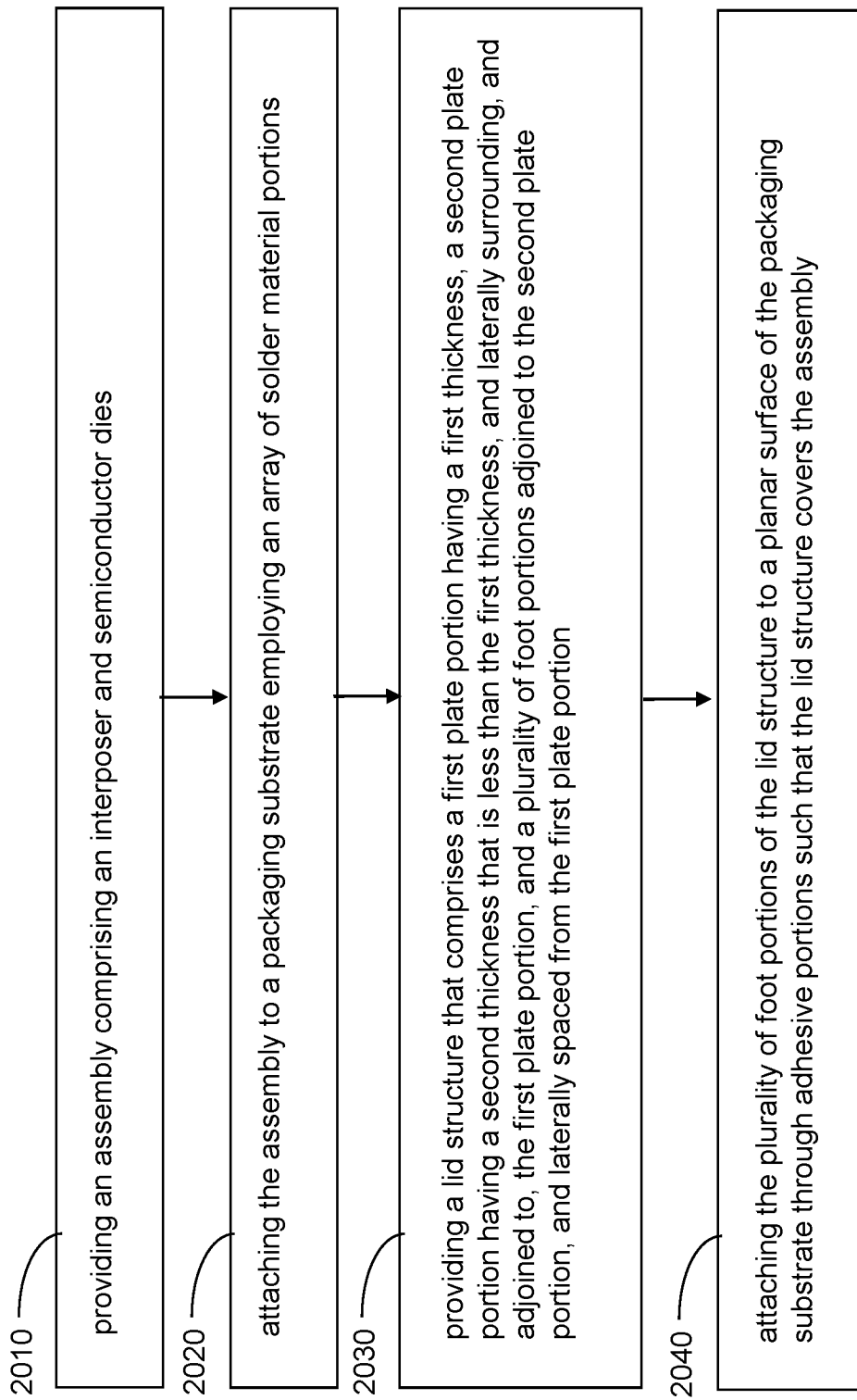
FIG. 20 is a flowchart illustrating steps for forming a chip package structure according to an embodiment of the present disclosure.

FIG. 20 is a flowchart illustrating steps for forming a chip package structure according to an embodiment of the present disclosure.

Referring to step 2010 and FIGS. 1A-10B, an assembly (such as a fan-out package 800) comprising an interposer 900 and semiconductor dies (701, 703) is provided.

Referring to step 2020 and FIGS. 11A-12, the assembly is attached to a packaging substrate 200 using solder material portions (such as an array of second solder material portions 290).

Referring to step 2030 and FIGS. 13A, 13B, 14A, and 14B, a lid structure 294 is provided, which comprises a first plate portion 2941 having a first thickness t1, a second plate portion 2942 having a second thickness t2 that is less than the first thickness t1, and laterally surrounding, and adjoined to, the first plate portion 2941, and a plurality of foot portions 294F adjoined to the second plate portion 2942 and laterally spaced from the first plate portion 2941.

Referring to step 2040 and FIGS. 15A-19, the plurality of foot portions 294F of the lid structure 294 may be attached to a planar surface of the packaging substrate 200 through adhesive portions 293 such that the lid structure 294 covers the assembly (such as the fan-out package 800).

Referring collectively to all drawings of the present disclosure and according to various embodiments of the present disclosure, a chip package structure is provided, which comprises: an assembly (such as a fan-out package

800) comprising an interposer 900 and semiconductor dies (701, 703); a packaging substrate 200 attached to the assembly (such as a fan-out package 800) through solder material portions (such as second solder material portions 290); and a lid structure 294 attached to the packaging substrate 200 and comprising: a first plate portion 2941 having a first thickness t1 and located in an interposer-projection region having an areal overlap with the interposer 900 in a plan view; a second plate portion 2942 having a second thickness t2 that is less than the first thickness t1, laterally surrounding, and adjoined to, the first plate portion 2941, and located outside the interposer-projection region; and a plurality of foot portions 294F adjoined to the second plate portion 2942, laterally spaced from the first plate portion 2941, and attached to a respective top surface segment of the packaging substrate 200 through a respective adhesive portion 293.

In one embodiment, each of the plurality of foot portions 294F laterally extends along a respective lateral direction (hd1 or hd2) that is parallel to one of sidewalls of the lid structure 294, and has a respective foot length FL along the respective lateral direction (hd1 or hd2); and the respective foot length FL is less than a maximum lateral dimension of the first plate portion 2941 along the respective lateral direction (hd1 or hd2).

In one embodiment, the second plate portion 2942 comprises four channel segments CS that are located between the first plate portion 2941 and a respective one of the foot portions 294F. In one embodiment, each of the four channel segments CS has a uniform channel width CW along a direction of a lateral spacing between the first plate portion 2941 and a most proximal one of the foot portions 294F. In one embodiment, the second plate portion 2942 comprises four corner plate portion segments CPS that are adjoined to the four channel segments CS; and each of the foot portions 294F has a respective foot length FL along a horizontal direction (hd1 or hd2) that is perpendicular to a direction of separation from the first plate portion 2941, and has a respective foot width FW along another horizontal direction (hd1 or hd2) that is parallel to the direction of separation from the first plate portion 2941.

In one embodiment, each of the four corner plate portion segments CPS has a respective first lateral dimension DGX along a first horizontal direction hd1 and a respective second lateral dimension DGY along a second horizontal direction hd2; and each of the first lateral dimensions DGX and the second lateral dimensions DGY is greater than any of the foot widths FW of the foot portions 294F.

In one embodiment, the four corner plate portion segments CPS of the second plate portion 2942 are adjoined to a respective pair of two outmost sidewalls of the lid structure 294. In one embodiment, the four corner plate portion segments CPS of the second plate portion 2942 are laterally spaced from outermost sidewalls of the lid structure 294 by a respective rim portion 294R of the lid structure 294 having a same vertical extent as the foot portions 294F.

In one embodiment, each of the foot portions 294F comprises a respective lengthwise sidewall (such as an inner lengthwise sidewall) that has: a top edge that is adjoined to the second plate portion 2942 within a horizontal plane that overlies a horizontal plane including a bottom surface of the first plate portion 2941; and a bottom edge located within another horizontal plane that underlies a bottommost surface of the assembly (such as a fan-out package 800).

In one embodiment, the chip package structure comprises a thermal interface material (TIM) layer 295 located between, and contacting, a top surface of the assembly (such as a fan-out package 800) and a bottom surface of the first plate portion 2941.

In one embodiment, the chip package structure comprises an intra-lid cavity 299 laterally surrounding the first plate portion 2941 and the assembly (such as a fan-out package 800), and laterally surrounded by the foot portions 294F, wherein the intra-lid cavity 299 is connected to an ambient located outside outmost sidewalls of the lid structure 294 through a plurality of openings located between the foot portions 294F as illustrated in FIGS. 15A-15D.

In one embodiment, the chip package structure comprises an intra-lid cavity 299 laterally surrounding the first plate portion 2941 and the assembly (such as a fan-out package 800), and laterally surrounded by the foot portions 294F, wherein the intra-lid cavity 299 is encapsulated within the lid structure 294, and is disconnected from an ambient located outside outmost sidewalls of the lid structure 294 by a combination of the foot portions 294F and rim portions 294R of the lid structure 294 that connect the foot portions 294F and having a lesser lateral thickness than the foot portions 294F as illustrated in FIGS. 16A-16D.

According to another aspect of the present disclosure, a chip package structure is provided, which comprises: an assembly (such as a fan-out package 800) comprising an interposer 900 and semiconductor dies (701, 703); a packaging substrate 200 attached to the assembly (such as a fan-out package 800) through solder material portions (such as second solder material portions 290); and a lid structure 294 attached to the packaging substrate 200 and comprising: a first plate portion 2941 having a first thickness t1 and located in an interposer-projection region having a same area as the interposer 900 in a plan view; a second plate portion 2942 having a second thickness t2 that is less than the first thickness t1, laterally surrounding, and adjoined to, the first plate portion 2941, and located outside the interposer-projection region; and a plurality of foot portions 294F adjoined to the second plate portion 2942, wherein top surfaces of the first plate portion 2941, the second plate portion 2942, and the plurality of foot portions 294F are located within a same horizontal plane.

In one embodiment, each of the plurality of foot portions 294F has a respective lengthwise sidewall that is parallel to a respective sidewall of the first plate portion 2941, has a lesser lateral thickness than the respective sidewall of the first plate portion 2941, and is laterally spaced from the respective sidewall of the first plate portion 2941 by a respective uniform spacing that equals a width of a respective channel segment CS of the second plate portion 2942.

The various embodiments of the present disclosure may reduce the risk of corner delamination of an underfill material portion (such as the second underfill material portion 292) between an interposer 900 and a packaging substrate 200. Simulations performed by the inventors of the present disclosure show that the probability of delamination of the second underfill material portion 292 in the structures of embodiments of the present disclosure may decrease by a percentage in a range from 6% to 14% compared to comparative structures that has no thickness differential between a first plate portion and a second plate portion (i.e., t2=t1) and all foot portions are merged as a single continuous structure. The simulations also showed that the probability of delamination of adhesive portions 293 in the structures of embodiments of the present disclosure may decrease by a percentage of about 70% compared to the comparative structure. Thus, the structures of the embodiments of the present disclosure may enhance mechanical reliability of a chip package structure.

The lid structures 294 according to various embodiments of the present disclosure provide advantageous structural features that allow local independent control of the stiffness of various portions of the lid structures 294. Such structural features include one or more of: thinning down of areas of the lid structure 294 located in a non-interposer projected region; removal of lid foot segments at four corners of the lid structures 294; and lid foot stiffness control through independent control of the foot lengths and foot widths. Each of, and/or the combination of, the structural features provide enhanced mechanical properties for the various embodiment lid structures 294 disclosed herein. The enhanced mechanical properties include prevention of underfill cracking in corner regions of an underfill material portion 292 that laterally surround solder material portions 29 (which may be C4 bumps) by releasing the mechanical stress, which may be generated during operation of the chip package or during reliability testing due to mismatch of coefficients of thermal expansion (CTE) between the semiconductor dies (701, 703) and the packaging substrate 200 and applied to the underfill material portion 292. Further, the embodiment structural features of the lid structures 294 may reduce stress peeling of the adhesive layer 293 during cool down of the chip package from an elevated temperature that may be reached during peak operation to a low temperature during idling, thereby preventing and/or reducing adhesive delamination and increasing the overall chip package lifetime.

Various embodiment structural features may provide enhanced mechanical properties for the lid structures 294 may also be used to tailor lid deformation characteristics. For example, to meet various requirements for package deformation limit for various types of chip package configurations the mode of deformation shape and/or magnitude may be adjusted. The various embodiment structural features may be used to provide package configurations having enhanced package deformation control in instances in which the semiconductor dies (701, 703) may be subjected to various die warp conditions. Such features may be advantageous in increasing the reliability for large chip packages with multiple semiconductor dies therein.

The various embodiment structural features may be advantageously used to provided enhanced thermal control for the chip package. For example, the bottom surface of a lid portion that contacts the thermal interface material (TIM) layer 295 may have a self-adapting mating contact across the entire area of the TIM layer 295. For example, the portion of the lid structures 294 located within an interposer-projection region (i.e., a region having an areal overlap with the interposer 900) may crying warp topography, which is a self-adapting mating contact between the TIM layer 295 and the overlying portion of the lid structure 294 and the underlying surfaces of the semiconductor dies (701, 703) and the molding compound die frame 910. Such self-adapting mating contact allows the TIM layer 295 to have more uniform mechanical stress distribution across the entire area of the TIM layer 295 during thermal expansion of the package substrate. Further, such self-adapting mating contact may avoid permanent deformation of the TIM layer 295 due to excessive compressive stress induced during a lid assembly process in which a downward clamping force is applied. In addition, the risk of delamination of the TIM layer 295 during a cooling stage of lid assembly process can be reduced, which may be accompanied with a temperature change from about 150 degrees Celsius to room temperature.

In addition to the mechanical advantages offering by the various embodiment structural features of the lid structures 294 disclosed herein, the various embodiment lid structures 294 may provide enhanced thermal performance during operation. Specifically, various embodiment lid structures 294 may dissipate more heat during operation of the semiconductor dies (701, 703), which may comprise system-on-chip semiconductor dies and/or high bandwidth memory (HBM) dies. Due to the reduction in the thickness in the second plate portion 2942 (located in a non-overlap area between the first plate portion and the foot portions) relative to the first plate portion 2942 having an areal overlap with the interposer 900 in a plan view, the first plate portion of a lid structure 294 can become deformable, and can conform to the topographical changes in the top surfaces of the semiconductor dies (701, 703). In other words, the various embodiment lid structures 294 disclosed herein may be more deformable, and thus, may provide mechanical compliancy/conformity within the area of the TIM layer 295 to dynamically conform the contour of the bottom surface of the first plate portion of the lid structures 294. Good thermal contact can be provided with the semiconductor dies (701, 703) even when the semiconductor dies (701, 703) develop warped topography at elevated temperatures during high workload conditions.

In some embodiments such as the embodiment illustrated in FIGS. 14A and 14B, the thickness and the length of the four rim portions 294R may be controlled to mitigate overall package coplanarity, for example, in a ball grid array (BGA) type package format. In this case, the four rim portions 294R may be employed to prevent BGA cold join during assembly of the chip package to a printed circuit board employing solder joints.

The various embodiment lid structures 294 of the present disclosure are generally deformable, and thus, provide better thermal performance during operation. For example, a system thermal solution (such as fan cooling or cold plate heat sink) can be mounted on top of the chip package of the present disclosure, and the mounting force of the system thermal solution may be transferred onto the lid structure 294 of the chip package. The deformability of the lid structure 294 of the chip package of the present disclosure can maintain the self-mating contact of the TIM layer 295 under such mechanical stress so that good thermal contact can be provided between multiple contact interfaces, e.g., an external thermal interface layer formed between the system thermal solution and the lid structure 294, and the TIM layer 295 located between the lid structure 294 and the fan-out package including the semiconductor dies (701, 703). The good thermal contact under adverse mechanical stress conditions may significantly enhance the overall heat dissipation from semiconductor dies (701, 703), through the lid structures 294, and to the system thermal solution.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure comprising:
   an assembly comprising an interposer and semiconductor dies;
   a packaging substrate attached to the assembly through solder material portions; and
   a lid structure attached to the packaging substrate and comprising:
   a first plate portion having a first thickness and located in an interposer-projection region having an areal overlap with the interposer in a plan view;
   a second plate portion having a second thickness that is less than the first thickness, laterally surrounding, and adjoined to, the first plate portion, and located outside the interposer-projection region; and
   a plurality of foot portions adjoined to the second plate portion, laterally spaced from the first plate portion, and attached to a respective top surface segment of the packaging substrate through a respective adhesive portion, wherein the second plate portion comprises four channel segments that are located between the first plate portion and a respective one of the plurality of foot portions.

2. The chip package structure of claim 1, wherein:
   each of the plurality of foot portions laterally extends along a respective lateral direction that is parallel to one of sidewalls of the lid structure, and has a respective foot length along the respective lateral direction; and
   the respective foot length is less than a maximum lateral dimension of the first plate portion along the respective lateral direction.

3. The chip package structure of claim 1, wherein each of the four channel segments has a uniform channel width along a direction of a lateral spacing between the first plate portion and a most proximal one of the foot portions.

4. The chip package structure of claim 1, wherein:
   the second plate portion comprises four corner plate portion segments that are adjoined to the four channel segments; and
   each of the plurality of foot portions has a respective foot length along a horizontal direction that is perpendicular to a direction of separation from the first plate portion, and has a respective foot width along another horizontal direction that is parallel to the direction of separation from the first plate portion.

5. The chip package structure of claim 4, wherein:
   each of the four corner plate portion segments has a respective first lateral dimension along a first horizontal direction and a respective second lateral dimension along a second horizontal direction; and
   each of the first lateral dimensions and the second lateral dimensions is greater than any of the foot widths of the foot portions.

6. The chip package structure of claim 4, wherein the four corner plate portion segments of the second plate portion are adjoined to a respective pair of two outmost sidewalls of the lid structure.

7. The chip package structure of claim 4, wherein the four corner plate portion segments of the second plate portion are laterally spaced from outermost sidewalls of the lid structure by a respective rim portion of the lid structure having a same vertical extent as the foot portions.

8. The chip package structure of claim 1, wherein each of the foot portions comprises a respective lengthwise sidewall that has:
   a top edge that is adjoined to the second plate portion within a horizontal plane that overlies a horizontal plane including a bottom surface of the first plate portion; and
   a bottom edge located within another horizontal plane that underlies a bottommost surface of the assembly.

9. The chip package structure of claim 1, further comprising a thermal interface material (TIM) layer located between, and contacting, a top surface of the assembly and a bottom surface of the first plate portion.

10. The chip package structure of claim 1, further comprising an intra-lid cavity laterally surrounding the first plate portion and the assembly, and laterally surrounded by the foot portions, wherein the intra-lid cavity is connected to an ambient located outside outmost sidewalls of the lid structure through a plurality of openings located between the foot portions.

11. The chip package structure of claim 1, further comprising an intra-lid cavity laterally surrounding the first plate portion and the assembly, and laterally surrounded by the foot portions, wherein the intra-lid cavity is encapsulated within the lid structure, and is disconnected from an ambient located outside outmost sidewalls of the lid structure by a combination of the foot portions and rim portions of the lid structure that connect the foot portions and having a lesser lateral thickness than the foot portions.

12. A chip package structure comprising:
    an assembly comprising an interposer and semiconductor dies;
    a packaging substrate attached to the assembly through solder material portions; and
    a lid structure attached to the packaging substrate and comprising:
    a first plate portion having a first thickness and located in an interposer-projection region having a same area as the interposer in a plan view;
    a second plate portion having a second thickness that is less than the first thickness, laterally surrounding, and adjoined to, the first plate portion, and located outside the interposer-projection region; and
    a plurality of foot portions adjoined to the second plate portion,
    wherein top surfaces of the first plate portion, the second plate portion, and the plurality of foot portions are located within a same horizontal plane, and wherein each of the plurality of foot portions has a respective lengthwise sidewall that is parallel to a respective sidewall of the first plate portion, has a lesser lateral thickness than the respective sidewall of the first plate portion, and is laterally spaced from the respective sidewall of the first plate portion by a respective uniform spacing that equals a width of a respective channel segment of the second plate portion.

13. The chip package structure of claim 12, wherein:
    the second plate portion comprises four corner plate portion segments that are adjoined to the four channel segments; and
    each of the plurality of foot portions has a respective foot length along a horizontal direction that is perpendicular to a direction of separation from the first plate portion, and has a respective foot width along another horizontal direction that is parallel to the direction of separation from the first plate portion.

14. The chip package structure of claim 12, further comprising an intra-lid cavity laterally surrounding the first plate portion and the assembly, and laterally surrounded by the foot portions, wherein the intra-lid cavity is connected to an ambient located outside outmost sidewalls of the lid structure through a plurality of openings located between the foot portions.

15. The chip package structure of claim 12, further comprising an intra-lid cavity laterally surrounding the first plate portion and the assembly, and laterally surrounded by the foot portions, wherein the intra-lid cavity is encapsulated within the lid structure, and is disconnected from an ambient located outside outmost sidewalls of the lid structure by a combination of the foot portions and rim portions of the lid structure that connect the foot portions and having a lesser lateral thickness than the foot portions.

16. A method of forming a chip package structure, the method comprising:
   providing an assembly comprising an interposer and semiconductor dies;
   attaching the assembly to a packaging substrate using solder material portions;
   providing a lid structure that comprises a first plate portion having a first thickness, a second plate portion having a second thickness that is less than the first thickness, and laterally surrounding, and adjoined to, the first plate portion, and a plurality of foot portions adjoined to the second plate portion and laterally spaced from the first plate portion; and
   attaching the plurality of foot portions of the lid structure to a planar surface of the packaging substrate through adhesive portions such that the lid structure covers the assembly, wherein each of the plurality of foot portions has a respective lengthwise sidewall that is parallel to a respective sidewall of the first plate portion, has a lesser lateral thickness than the respective sidewall of the first plate portion, and is laterally spaced from the respective sidewall of the first plate portion by a respective uniform spacing that equals a width of a respective channel segment of the second plate portion.

17. The method of claim 16, wherein:
   the first plate portion is located in an interposer-projection region having an areal overlap with the interposer in a plan view upon attaching the plurality of foot portions of the lid structure to the planar surface of the packaging substrate; and
   the second plate portion is located outside the interposer-projection region upon attaching the plurality of foot portions of the lid structure to the planar surface of the packaging substrate.

18. The method of claim 16, further comprising forming a thermal interface material (TIM) layer between a top surface of the assembly and a bottom surface of the first plate portion such that the TIM layer contacts the top surface of the assembly and the bottom surface of the first plate portion.

19. The method of claim 16, wherein:
   an intra-lid cavity laterally surrounding the first plate portion and the assembly is formed upon attaching the plurality of foot portions of the lid structure to the planar surface of the packaging substrate;
   the intra-lid cavity is laterally surrounded by the foot portions; and
   the intra-lid cavity is connected to an ambient located outside outmost sidewalls of the lid structure through a plurality of openings located between the foot portions.

20. The method of claim 16, wherein:
   an intra-lid cavity laterally surrounding the first plate portion and the assembly is formed upon attaching the plurality of foot portions of the lid structure to the planar surface of the packaging substrate;
   the intra-lid cavity is laterally surrounded by the foot portions; and
   the intra-lid cavity is encapsulated within the lid structure, and is disconnected from an ambient located outside outmost sidewalls of the lid structure by a combination of the foot portions and rim portions of the lid structure that connect the foot portions and having a lesser lateral thickness than the foot portions.

* * * * *